(12) United States Patent
Fujimoto et al.

(10) Patent No.: US 7,200,094 B2
(45) Date of Patent: *Apr. 3, 2007

(54) REPRODUCED SIGNAL EVALUATION APPARATUS AND METHOD, REPRODUCTION APPARATUS AND METHOD, AND RECORDING APPARATUS AND METHOD

(75) Inventors: Kensuke Fujimoto, Kanagawa (JP); Shunji Yoshimura, Tokyo (JP); Atsushi Fukumoto, Kanagawa (JP); Yasuhito Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 38 days.

This patent is subject to a terminal disclaimer.

(21) Appl. No.: 11/113,557

(22) Filed: Apr. 25, 2005

(65) Prior Publication Data

US 2005/0190630 A1 Sep. 1, 2005

Related U.S. Application Data

(62) Division of application No. 10/017,156, filed on Dec. 14, 2001, now Pat. No. 6,940,800.

(30) Foreign Application Priority Data

Dec. 15, 2000 (JP) ............................. 2000-382595
Aug. 15, 2001 (JP) ............................. 2001-246697

(51) Int. Cl.
*G11B 5/76* (2006.01)
(52) U.S. Cl. .................................. 369/59.22; 369/47.15

(58) Field of Classification Search .................... None
See application file for complete search history.

(56) References Cited

U.S. PATENT DOCUMENTS 5,938,791 A 8/1999 Narahara (Continued)

FOREIGN PATENT DOCUMENTS

EP 0 419 432 3/1991

OTHER PUBLICATIONS

T. Perkins and Z. Keirn: "A Window-Margin-Like Procedure for Evaluating PRML Channel Performance" IEEE Transactions on Magnetics, vol. 31, No. 2, Mar. 1995, pp. 1109-1114, XP002192543.

(Continued)

*Primary Examiner*—Paul W. Huber
(74) *Attorney, Agent, or Firm*—Frommer Lawrence & Haug LLP; William S. Frommer; Thomas F. Presson

(57) ABSTRACT

The present invention provides an apparatus and a method for precisely and adequately evaluating actual quality of reproduced data whenever applying a maximum likelihood decoder for converting signal reproduced from a recording medium into binary signal Based on data arrays of a pair of binary data outputted from a "Viterbi" decoder, SAM values are secured by selecting any of path-metric differential values (00) and (11) being the difference between a pair of values compared when renewing path-metric values PMM (00) and (11) outputted from the "Viterbi" decoder. The minimum SAM value for an ideally-reproduced signal is outputted from a constant generating circuit. If the SAM values are verified as valid, and yet, if the SAM values coincide with the equation "input SAM values"≦"data value outputted from the constant generating circuit", then squared values outputted from a square circuit are averaged by an averaging circuit. Finally, the average value is outputted as the reproduced signal evaluation.

13 Claims, 19 Drawing Sheets

U.S. PATENT DOCUMENTS 6,148,043 A    11/2000  Fujimoto
6,442,730 B1 *  8/2002  Schachner et al. .......... 714/795

OTHER PUBLICATIONS

N. Yeh and D. Wachenschwanz: "Amplitude Margin Analysis in High Density Disk Recording Using a Pseudo-Random Sequence" IEEE Transactions on Magnetics, vol. 33, No. 5, Sep. 1997, pp. 2962-2964, XP002192544.

Perkins T et al: "Determining Prml Channel Error Rate Performance By Window Margin-Like Approximation" Annual Magnetic Recording Conference on Signal Processing, XX, XX, Aug. 14, 1994, pp. 40-41, XP010260666.

* cited by examiner

FIG.3

| BINARY DATA ARRAY | SAM |
|---|---|
| 00 | PATH-METRIC DIFFERENCE(00) |
| 01 | VOID |
| 10 | VOID |
| 11 | PATH-METRIC DIFFERENCE(11) |

REPRODUCED SIGNAL EVALUATION APPARATUS AND METHOD, REPRODUCTION APPARATUS AND METHOD, AND RECORDING APPARATUS AND METHOD

This is a divisional application of U.S. application Ser. No. 10/017,156, filed Dec. 14, 2001 now U.S. Pat. No. 6,940,800.

CROSS REFERENCE TO RELATED APPLICATIONS

This application claims priority to Japanese Patent Applications No. JP 2000-382595 filed on Dec. 15, 2000, and No. JP 2001-246697 filed on Aug. 15, 2001, the disclosure of such applications being herein incorporated by reference to the extent permitted by law.

BACKGROUND OF THE INVENTION

1. Field of the Invention

The present invention relates to a reproduced signal evaluation apparatus and method, a reproduction apparatus and method for an adequate evaluation of signal reproduced from a storage medium, and yet, it also relates to a recording medium and a recording method using such recording medium.

2. Description of the Related Art

In order to realize a high-density recording in a data storage apparatus in a practical manner, it is necessary to secure a certain margin against a variety of factors such as discrepancies or deviations in the process of manufacturing a storage apparatus, variation with time of operation performance of the storage apparatus, variation of temperature and discrepancies in operation performance of a recording medium used in the storage apparatus. In a signal reproducing system, if the storage apparatus incorporates a means for detecting an actual value for an evaluation of the quality of reproduced signal on a real-time basis, it is possible to operate the storage apparatus to automatically adjust the reproducing condition based on the evaluation value, whereby contributing to a substantial increase of the margin itself.

It is essential that the above evaluation value be detected with high precision and at considerable high speed. A value having significance in the evaluation of a reproduced signal is an error rate of the reproduced signal. However, in order to accomplish a stable measurement of error rate, a relatively long period of time is required. To deal with this problem, conventional practice often utilizes a jitter component of the reproduced signal as an evaluation value from an actual quality of a reproduced signal. Jitter component is a fluctuation component of the difference between a time at which a reproduced signal crosses a threshold value that constitutes a reference for encoding the reproduced signal into binary data and the time at which the reproduced signal is discriminated as binary data and it is usually expressed as a standard deviation. Originally, it is conceived as the premise that evaluation of reproduced signal via utilization of a jitter component is based on detection of a threshold value as a means for encoding the reproduced signal into binary data.

On the other hand, in recent years, as a result of the development of technology related to LSI (large-scale integrated circuit), as a practical means for encoding reproduced signal into binary signal for the sake of achieving higher recording density, such a decoder using a method of maximum likelihood typically represented by a "Viterbi" decoder for example, has become easily available. When reproducing such data aligned in arrays and recorded by way of providing correlation between them, the decoder using the method of maximum likelihood encodes them into binary signal by way of detecting the most likely array.

Nevertheless, even when encoding the reproduced signal into binary signal by applying such a "maximum likelihood" decoder cited above, in many cases, conventional practice still utilizes jitter component to determine the value from evaluation of actual quality of the reproduced signal. When utilizing this method, correlation between the actually evaluated value and the actual error rate is reduced. As a result, even after adjusting the reproducing condition based on the jitter component, such a problem is often generated, for the reproducing condition deviates from such a condition allowing minimization of the error rate.

SUMMARY OF THE INVENTION

The present invention aims at providing an apparatus and a method of evaluation of reproducing signal, a reproduction apparatus and a reproduction method, and a recording apparatus and a method of recording reproduced signal, which are respectively capable of properly evaluating actual quality of reproduced signal at a faster rate when utilizing such a "maximum likelihood" decoder for encoding signal reproduced from a recording medium into binary signal.

In view of the above mentioned problems, it is desirable to have a preferred embodiment of the present invention provides an apparatus for evaluating a signal reproduced from a recording medium, including:

a binary data detecting means for decoding the signal reproduced from the recording medium by maximum likelihood decoding;

a SAM value computing means for computing a SAM value in real time based on a result of detection by the binary data detecting means, wherein SAM means Sequenced Amplitude Margin; and a reproduced signal evaluation means for evaluating the reproduced signal based on the SAM value computed by the SAM value computing means.

In addition, according to another preferred embodiment of the present invention, a reproduced signal evaluation method is provided for evaluating a signal reproduced from a recording medium, the method including:

a binary data detecting step for detecting binary data by decoding the signal reproduced from the recording medium by maximum likelihood decoding;

a SAM value computing step for computing a SAM value in real time based on a result of detection by the binary data detecting step; and a reproduced signal evaluation step for evaluating the reproduced signal based on the SAM value computed by the SAM value computing step.

Also, another preferred embodiment of the present invention provides a reproducing apparatus for reproducing a signal recorded on a recording medium and converting the signal into binary data, the reproducing apparatus including:

a reproducing means for reproducing a signal recorded on the recording medium;

a binary data detecting means for detecting binary data by decoding the signal reproduced from the reproducing means by maximum likelihood decoding;

a SAM value computing means for computing a SAM value based on a result of detection from the binary data detecting means;

a reproduced signal evaluation means for evaluating the reproduced signal based on the SAM value computed by the SAM value computing means; and a reproduction controlling means for controlling the reproducing means based on a result of the evaluation by the reproduced signal evaluation means.

It is also desirable, according to another preferred embodiment of the present invention, to provide a reproduction method for reproducing a signal recorded on a recording medium and converting the reproduced signal into binary data, the reproduction method including reproducing step for reproducing the signal recorded on the recording medium;

binary data detecting step for detecting binary data by decoding a signal reproduced from the reproducing step by maximum likelihood decoding;

SAM value computing step for computing a SAM value based on a result of detection from the binary data detecting stepwherein SAM means Sequenced Amplitude Margin;

reproduced signal evaluation step for evaluating the reproduced signal based on the SAM value computed by the SAM value computing step; and reproduction controlling step for controlling the reproducing step based on a result of the evaluation by the reproduced signal evaluation step.

Another preferred embodiment of the present invention provides a recording apparatus for recording modulated data on a recording medium, the apparatus including:

a recording means for modulating data and recording the data on the recording medium;

a reproducing means for reproducing a signal recorded on the recording medium;

a binary data detecting means for detecting binary data by decoding the signal reproduced from the reproducing means by maximum likelihood decoding;

a SAM value computing means for computing a SAM value based on a result of detection from the binary data detecting means;

a reproduced signal evaluation means for evaluating the reproduced signal based on the SAM value computed by the SAM value computing means; and a recording controlling means for controlling the recording means based on a result of the evaluation by the reproduced signal evaluation means.

Still, another preferred embodiment of the present invention provides a recording method for recording modulated data on a recording medium, the method including:

a recording step for modulating data and recording the data on the recording medium;

a reproducing step for reproducing a signal recorded on the recording medium;

a binary data detecting step for detecting binary data by decoding the signal reproduced from the reproducing step by maximum likelihood decoding;

a SAM value computing step for computing a SAM value based on a result of detection from the binary data detecting step;

a reproduced signal evaluation step for evaluating the reproduced signal based on the SAM value computed by the SAM value computing step; and a recording controlling step for controlling the recording step based on a result of the evaluation by the reproduced signal evaluation step.

Moreover, another preferred embodiment of the present invention provides a reproduced signal evaluation apparatus for evaluating a signal reproduced from a recording medium on which data modulated by a modulation code having a minimum run of one or more is stored, the reproduced signal evaluation apparatus including:

a binary data detecting means for detecting binary data after decoding, by applying maximum likelihood decoding, the signal reproduced from the recording medium on which data modulated by the modulation code having the minimum run of one or more is stored;

a SAM value computing means for computing a SAM value based on a detection result of the binary data detecting means; and a reproduced signal evaluation means for selecting from SAM values computed by the SAM computing means, the SAM values being within a predetermined range of values, and evaluating the reproduced signal by statistically processing the selected SAM values.

Another preferred embodiment of the present invention still provides a reproduced signal evaluation method for evaluating a signal reproduced from a recording medium on which data modulated by a modulation code having a minimum run of one or more is stored, the reproduced signal evaluation method including:

a binary data detecting step for detecting binary data after decoding by applying maximum likelihood decoding, the signal reproduced from a recording medium on which the data modulated by the modulation code having the minimum run of one or more is stored;

a SAM value computing step for computing a SAM value based on a detection result of the binary data detecting step; and a reproduced signal evaluation step for selecting, from SAM values computed by the SAM computing step, the SAM values being within a predetermined range of values, and then evaluating the reproduced signal by a statistical process the selected SAM values.

Another preferred embodiment of the present invention provides a reproducing apparatus for reproducing a signal from a recording medium on which data modulated by a modulation code having a minimum run of one or more is stored, the reproducing apparatus including:

a reproducing means for reproducing a signal from a recording medium on which data modulated by using the modulation code having the minimum run of one or more is stored;

a binary data detecting means for detecting binary data after decoding the reproduced signal reproduced from the recording medium by the reproducing means applying a maximum likelihood decoding;

a SAM value computing means for computing a SAM value based on a detection result of the binary data detecting means;

a reproduced signal evaluation means for selecting from SAM values computed by the SAM computing means, the SAM values being within a predetermined range of values, and evaluating the reproduced signal by a applying a statistical process to the selected SAM values; and a reproduction controlling means for controlling the reproducing means based on a result of the evaluation by the reproduced signal evaluation means.

In addition, another preferred embodiment of the present invention provides a reproducing method for reproducing a signal from a recording medium on which data modulated by a modulation code having a minimum run of one or more is stored, the reproducing method including:

a reproducing step for reproducing the signal from the recording medium on which data modulated by the modulation code having the minimum run of one or more is stored;

a binary data detecting step for detecting the binary data after decoding the reproduced signal reproduced from the recording medium by the reproducing step applying maximum likelihood decoding;

a SAM value computing step for computing a SAM value based on a detection result of the binary data detecting step;

a reproduced signal evaluation step for selecting from SAM values computed by the SAM computing step, the SAM values being within a predetermined range of values, and evaluating the reproduced signal by a applying a statistical process to the selected SAM values; and a reproduction controlling step for controlling the reproducing step based on a result of the evaluation by the reproduced signal evaluation step.

Another preferred embodiment of the present invention provides a recording apparatus for recording data on a recording medium upon modulating the data by using a modulation code having a minimum run of one or more, the reproducing apparatus including:

a recording means for recording the data on the recording medium after the data is modulated by the modulation code having the minimum run of one or more;

a reproducing means for reproducing a signal from the recording medium after recording the data on the recording medium with the recording means;

a binary data detecting means for detecting binary data after decoding a reproduced signal reproduced from the recording medium by the reproducing means applying a maximum likelihood decoding;

a SAM value computing means for computing a SAM value based on a detection result of the binary data detecting means;

a reproduced signal evaluation means for selecting, from SAM values computed by the SAM computing means, a SAM value being within a predetermined range of values, and evaluating the reproduced signal by a applying a statistical process to the selected SAM values; and a recording controlling means for controlling the reproducing means based on a result of the evaluation by the reproduced signal evaluation means.

According to still another preferred embodiment of the present invention, a recording method is provided for recording data on a recording medium upon modulating the data by using a modulation code having a minimum run of one or more, the reproducing method including:

a recording step for recording data on the recording medium after the data is modulated by the modulation code having the minimum run of one or more;

a reproducing step for reproducing a signal from the recording medium after recording the signal on the recording medium with the recording step;

a binary data detecting step for detecting binary data after decoding a reproduced signal reproduced from the recording medium by the reproducing step applying a maximum likelihood decoding;

a SAM value computing step for computing a SAM value based on a detection result of the binary data detecting step;

a reproduced signal evaluation step for selecting, from SAM values computed by the SAM computing step, a SAM value being within a predetermined range of values, and evaluating the reproduced signal by a applying a statistical process to the selected SAM values; and a recording controlling step for controlling the reproducing step based on a result of the evaluation by the reproduced signal evaluation step.

Moreover, another preferred embodiment of the present invention provides a reproduced signal evaluation apparatus for evaluating a signal reproduced from a recording medium on which data modulated by a modulation code having a minimum run of one or more is stored, the reproduced signal evaluation apparatus including:

a binary data detecting means for detecting binary data after decoding by applying maximum likelihood decoder, a signal reproduced from a recording medium on which data modulated by the modulation code having the minimum run of one or more is stored;

a SAM value computing means for computing a SAM value based on the reproduced signal; and a reproduced signal evaluation means for performing pattern matching against a pattern of data array obtained from the binary data detected by the binary data detecting means; selecting a SAM value for the pattern having a minimum SAM if a reproduced wave form is ideal; and evaluating the reproduced signal by applying a statistical process to the selected SAM.

There is also provided, according to another preferred embodiment of the present invention, a reproduced signal evaluation method for evaluating a signal reproduced from a recording medium on which data modulated by a modulation code having a minimum run of one or more is stored, the reproduced signal evaluation method including:

a binary data detecting step for detecting binary data after decoding by applying maximum likelihood decoding, a signal reproduced from a recording medium on which data modulated by the modulation code having the minimum run of one or more is stored;

a SAM value computing step for computing a SAM value based on the reproduced signal; and a reproduced signal evaluation step for performing pattern matching against a pattern of data array obtained from the binary data detected by the binary data detecting step; selecting a SAM value for the pattern having minimum SAM if a reproduced wave form is ideal; and evaluating the reproduced signal by a applying a statistical process to the selected SAM value.

Another preferred embodiment of the present invention provides a reproducing apparatus for reproducing a signal from a recording medium on which data modulated by a modulation code having a minimum run of one or more is stored, the reproducing apparatus including:

a reproducing means for reproducing a signal from a recording medium on which data modulated by using the modulation code having the minimum run of one or more is stored; a binary data detecting means for detecting binary data after decoding a reproduced signal reproduced from the recording medium by the reproducing means applying a maximum likelihood decoding;

a SAM value computing means for computing a SAM value based on the reproduced signal;

a reproduced signal evaluation means for performing pattern matching against a pattern of data array obtained from the binary data detected by the binary data detecting means; selecting a SAM value for the pattern having minimum SAM if a wave form is ideal; and evaluating the reproduced signal by applying a statistical process to the selected SAM value; and a recording controlling means for controlling the reproducing means based on a result of the evaluation by the reproduced signal evaluation means.

Still, another preferred embodiment of the present invention provides a reproducing method for reproducing a signal from a recording medium on which data modulated by a modulation code having a minimum run of one or more is stored, the reproducing method including:

a reproducing step for reproducing a signal from a recording medium on which data modulated by the modulation code having the minimum run of one or more is stored;

a binary data detecting step for detecting binary data after decoding the reproduced signal reproduced from the recording medium by the reproducing step applying maximum likelihood decoding;

a SAM value computing step for computing a SAM value based on the reproduced signal;

a reproduced signal evaluation step for performing pattern matching against a pattern of data array obtained from the binary data detected by the binary data detecting step; selecting a SAM value for the pattern having minimum SAM if a reproduced wave form is ideal; and evaluating the reproduced signal by a applying a statistical process to the selected SAM value; and a recording controlling step for controlling the reproducing step based on a result of the evaluation by the reproduced signal evaluation step.

In addition, another preferred embodiment of the present invention provides a recording apparatus for recording data on a recording medium upon modulating the data by using a modulation code having a minimum run of one or more, the reproducing apparatus including:

a recording means for recording data on the recording medium after the data is modulated by the modulation code having the minimum run of one or more;

a reproducing means for reproducing a signal from the recording medium after recording the signal on the recording medium with the recording means;

a binary data detecting means for detecting binary data after decoding a reproduced signal reproduced from the recording medium by the reproducing means applying a maximum likelihood decoding;

a SAM value computing means for computing a SAM value based on the reproduced signal;

a reproduced signal evaluation means for performing pattern matching against a pattern of data array obtained from the binary data detected by the binary data detecting means; selecting a SAM value for the pattern having minimum SAM if a wave form is ideal; and evaluating the reproduced signal by a applying a statistical process to the selected SAM value; and a recording controlling means for controlling the reproducing means based on a result of the evaluation by the reproduced signal evaluation means.

Moreover, another preferred embodiment of the present invention provides a recording method for recording data on a recording medium upon modulating the data by using a modulation code having a minimum run of one or more, the reproducing method including:

a recording step for recording data on the recording medium after the data is modulated by the modulation code having the minimum run of one or more;

a reproducing step for reproducing a signal from the recording medium after recording the signal on the recording medium with the recording step;

a binary data detecting step for detecting binary data after decoding a reproduced signal reproduced from the recording medium by the reproducing step applying a maximum likelihood decoding;

a SAM value computing step for computing a SAM value based on the reproduced signal;

a reproduced signal evaluation step for performing pattern matching against a pattern of data array obtained from the binary data detected by the binary data detecting step; selecting a SAM value for the pattern having minimum SAM if a reproduced wave form is ideal; and evaluating the reproduced signal by a applying a statistical process to the selected SAM value; and a recording controlling step for controlling the reproducing means based on a result of the evaluation by the reproduced signal evaluation step.

Still, according to another preferred embodiment of the present invention, there is provided a reproduced signal evaluation apparatus for evaluating a signal reproduced from a recording medium, including:

a binary data detector decoding the signal reproduced from the recording medium using maximum likelihood decoding;

a SAM value computation unit computing a SAM value based on the detection result; and a reproduced signal evaluation unit evaluating the reproduced signal based on the computed SAM value.

Also, another preferred embodiment of the present invention provides a reproduced signal evaluation method for evaluating a signal reproduced from a recording medium, the method including:

detecting binary data by decoding the signal reproduced from the recording medium using maximum likelihood decoding;

computing a SAM value based on the detection result; and evaluating the reproduced signal based on the computed SAM value.

Furthermore, according to still another preferred embodiment of the present invention, there is provided a reproducing apparatus for reproducing a signal recorded on a recording medium and converting the signal into binary data, the reproducing apparatus including:

a reproducing unit reproducing a signal recorded on the recording medium;

a binary data detector detecting binary data by decoding the signal reproduced from the reproducing means using maximum likelihood decoding;

a SAM value computation unit computing a SAM value based on the detection result;

a reproduced signal evaluation unit evaluating the reproduced signal based on the computed SAM value; and a reproduction controller controlling the reproducing unit based on the evaluation result.

In addition, another further preferred embodiment of the present invention provides a reproduction method for reproducing a signal recorded on a recording medium and converting the reproduced signal into binary data, the reproduction method including:

reproducing the signal recorded on the recording medium;

detecting binary data by decoding the reproduced signal using maximum likelihood decoding;

computing a SAM value based on the detection result;

evaluating the reproduced signal based on the computed SAM value; and controlling the reproducing based on the evaluation result.

According to the preferred embodiments of the present invention described above, binary data is detected by decoding the signal reproduced from the recording medium by maximum likelihood decoding, a SAM value is computed in real time based on a result of the detection of the binary data and the reproduced signal is evaluated based on the computed SAM value. As a result, it is expected that evaluation of a reproduced signal is performed in approximately real time.

In addition, binary data is detected after being decoded by applying maximum likelihood decoding to a signal reproduced from a recording medium on which data modulated by the modulation code having the minimum run of one or more is stored, a SAM value is computed based on a detection result of the detection of the binary data, and from the computed SAM values, the SAM values being within a predetermined range of values are selected, then the reproduced signal is evaluated by statistically processing the selected SAM values. As a result, along with evaluating of a reproduced signal in approximately real time, it is expected that evaluation can be carried out more accurately as compared with the prior art.

Also, binary data is detected after decoding, by applying maximum likelihood decoder, a signal reproduced from a recording medium on which data modulated by the modulation code having the minimum run of one or more is stored, while a SAM value is computed based on the reproduced signal and pattern matching is done against a pattern of data array obtained from the detected binary data detected, a SAM value is selected for the pattern having a minimum SAM if a reproduced wave form is ideal, and the reproduced signal is evaluated by applying a statistical process to the selected SAM. As a result, it is expected that evaluation can be carried out more accurately as compared with the prior art.

As described above, the preferred embodiments of present invention provide reproduced signal evaluation values that are computed by applying compared values whenever renewing path-metrics, whereby making it possible to acquire such values for evaluation of reproduced signal having higher correlation with error rate of reproduced signal at a faster processing rate.

Further, by way of applying the preferred embodiments of the present invention to a recording and/or reproducing apparatus, and yet, by way of properly adjusting a data recording and/or reproducing apparatus based on the reproduced signal evaluation values secured via the inventive means, the present invention may provide an effect in which it is possible to realize high-density recording with higher accuracy.

Moreover, according to some of the preferred embodiments of the present invention described above, reproduced signal evaluation values are computed by way of executing pattern-matching against detected data array. As a result, the preferred embodiments of the present invention may provide an embodiment capable of securing more reliable reproduced signal evaluation values by way of effectively utilizing a greater amount of data. Furthermore, by virtue of utilizing a pattern-matching process, the preferred embodiments of the present invention further may provide an effect in which it is possible to obtain reproduced signal evaluation values without necessarily depending on the characteristics of modulation codes of the recorded data.

BRIEF DESCRIPTION OF THE DRAWINGS

The above and other objects, features and advantages of the present invention will become more apparent from the following description of the presently preferred exemplary embodiment of the invention taken in conjunction with the accompanying drawings, in which:

FIG. 3 shows a chart that exemplifies output of SAM values according to a preferred embodiment of to the present invention;

DESCRIPTION OF THE PREFERRED EMBODIMENTS OF THE INVENTION

With reference to the accompanying drawings, a first preferred embodiment of the present invention is described below.

In the present invention, based on such a value called SAM (Sequenced Amplitude Margin), evaluation values suitable for a reproduction system utilizing a decoder using a method of maximum likelihood (hereinafter referred to simply as maximum likelihood decoder) are acquired. When operating the maximum likelihood decoder, a SAM value corresponds to a difference between a correct path metric and another path metric which is closest to the correct path metric. For example, the above-cited SAM is reported in "A Window-Margin-Like Procedure for Evaluating PRML Channel Performance", IEEE Trans. Magazine. Vol. 31, No. 2, pp 1109~1114, by Tim Perkins and Zachary A. Keirn.

Conventionally, the SAM evaluation system utilizes a storage oscilloscope, in which acquired data is calculated (computed) by a computer. Unlike the conventional practice, in the present invention, values for evaluation of reproduced signal are obtained based on SAM values obtained at nearly real time by computation of the SAM values executed by a data recording/reproducing apparatus itself.

The SAM component corresponds to a noise margin which is allowable to a level in which a maximum likelihood decoder eventually outputs an erroneous binary data array. Actually, in the course of processing reproduced signal, it is difficult to generate genuinely correct binary data array in a short delay time. As a result, it is a practical method to utilize a difference (Mr–Mw) between a degree of probability of a data array judged by the maximum likelihood decoder to be most probable (path-metric Mr) and a degree of probability of such a data array judged to be erroneous (path-metric Mw) as a practical SAM value. Usually, in such circumstances in which evaluation of the quality of reproduced signal is desired, it is conceived that there is a little error rate in such a data array judged by the maximum likelihood decoder to be most probable, and thus, in strict sense, there is merely a negligible difference between the SAM value sought via the above process and the critically sought SAM value.

Next, the maximum likelihood decoder and the SAM value computing unit according to a first preferred embodiment of the present invention are described below. The first preferred embodiment of the present invention utilizes a "Viterbi" decoder which functions as a maximum likelihood decoder. The following description refers to a RLL (run length limited) code (1,7) (minimum run limit=1) as a modulation code, and a PR (partial response) (1,2,1) "Viterbi" decoder functioning as a maximum likelihood decoder.

Figure 1:
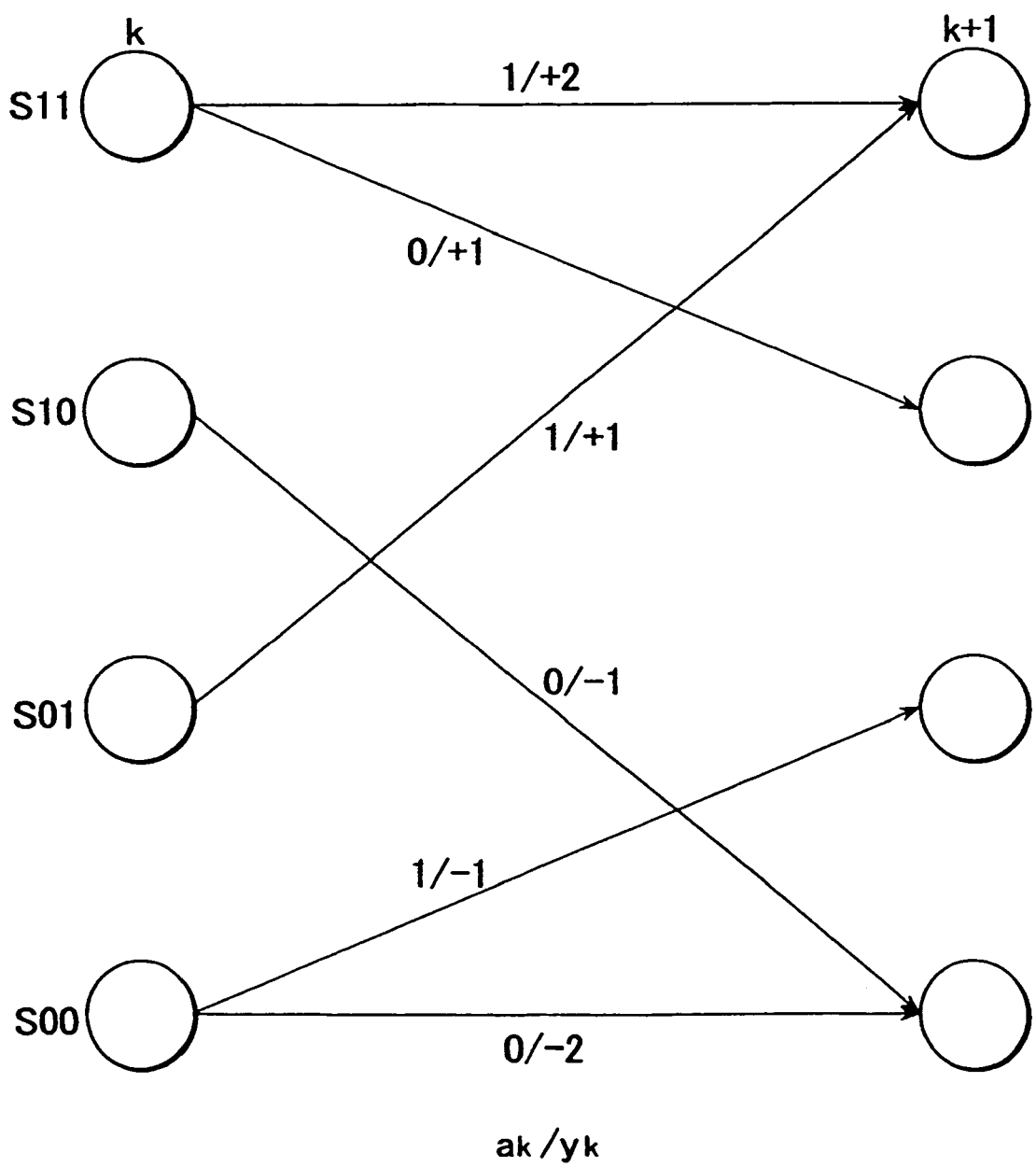
FIG. 1 shows a trellis diagram corresponding to a combination of RLL (1,7) and PR (1,2,1) according to a preferred embodiment of to the present invention.

FIG. 1 designates a trellis chart corresponding to a combination of the above-referred RLL (1,7) and PR (1,2,1). In FIG. 1, transition of state is expressed from a time "k" to a time "k+1". States S00, S01, S10, and S11, respectively correspond to such a state in which any of the states are determined by a combination of data corresponding to past two bits from the present moment. The value "ak" designates binary data, whereas the value "yk" designates an ideally-reproduced signal.

Figure 2:
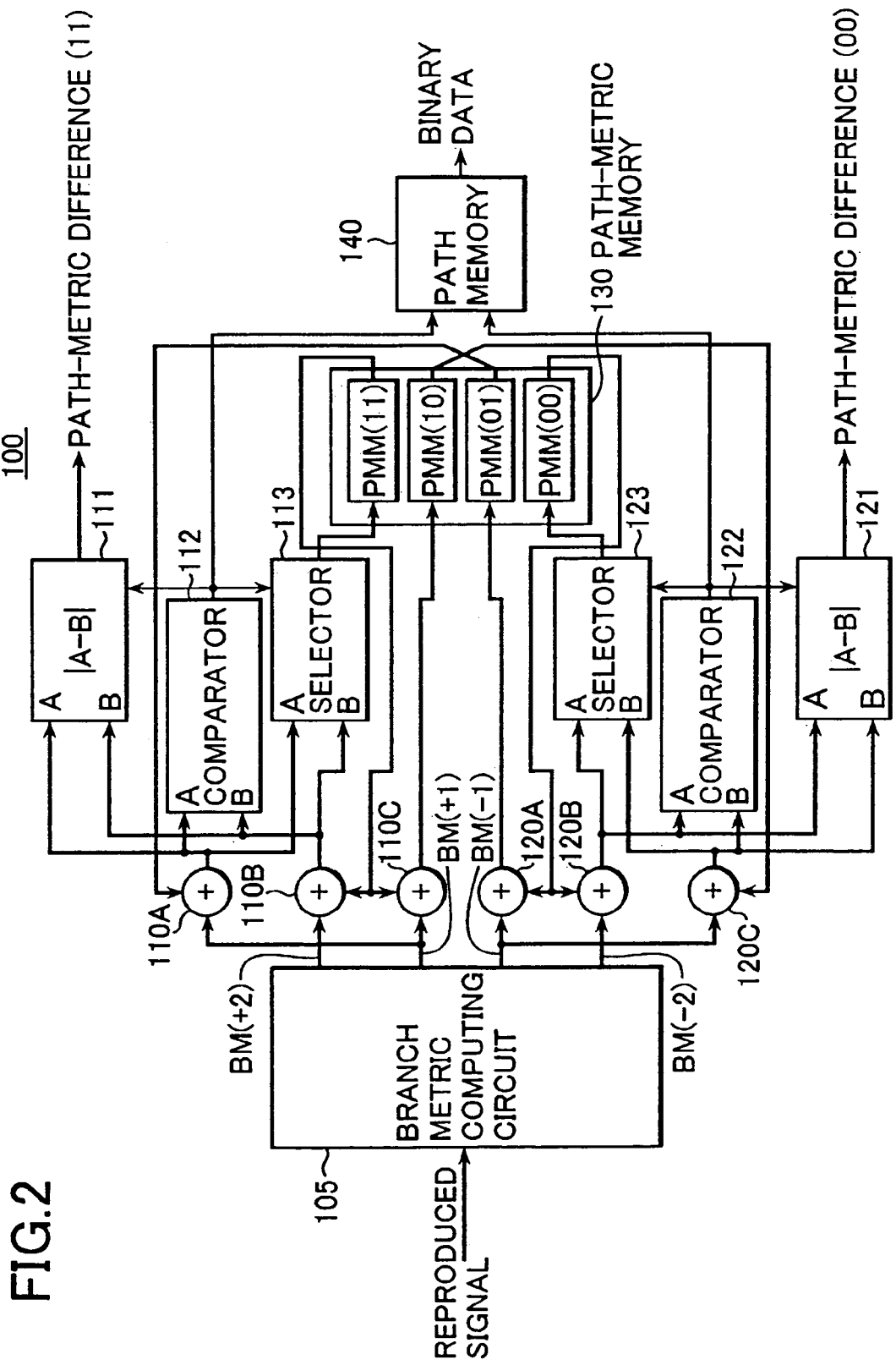
FIG. 2 shows a schematic block diagram exemplifying a structure of a "Viterbi" decoder based on the trellis diagram corresponding to the combination RLL (1,7) and PR (1,2,1) shown in FIG. 1 according to a preferred embodiment of to the present invention.

FIG. 2 designates a simplified block diagram of an exemplified structure of a "Viterbi" decoder 100 based on the trellis chart shown in FIG. 1. For example, such signal reproduced by a reproduction head is transmitted from a recording medium such as an magneto-optical disc to a branch-metric computing circuit 105. In the branch-metric computing circuit 105, metric of actually reproduced signal is computed per channel bit against four kinds of level of ideal reproduced signal.

Frequently, an actual "Viterbi" decoder applies as a metric, Euclidean distance "x (−1)" between an ideally-reproduced signal "yk" and an actual reproduced signal "$z_k$". In other words, in order to define such a branch metric BM (y) against the level "y" of the ideally-reproduced signal, it is suggested that such an equation shown below be computed.

$$BM(y) = -(y - z_k)^2 \quad (1)$$

On the other hand, a path-metric memory 130 stores such a path on a trellis selected via a method to be described later on, in other words, the path-metric memory 130 stores cumulative values of such branch metric corresponding to the pattern of a data array. In other words, the path-metric memory 130 stores four values in correspondence with the kinds of the state at which individual paths eventually arrive. FIG. 2 describes a state in which corresponding four values are individually stored in four domains including PMM (11), PMM (10), PMM (01), and PMM (00) inside of the path-metric memory 130. In other words, the value of the state S11 is stored in the domain PMM (11). Likewise, the value of the state S10 is stored in the domain PMM (10). The value of the state S01 is stored in the domain PMM (01), and the value of the state S00 is stored in the domain PMM (00).

In addition, the following description refers to the values stored in the domains PMM (11), PMM (10), PMM (01), and PMM (00), as PMM (11), PMM (10), PMM (01), and PMM (00), respectively.

When shifting from the time "k" to the time "k+1", in compliance with the following equations (2)~(5), those values stored in the above domains PMM (11), PMM (10), PMM (01), and PMM (00) inside of the path-metric memory 130 are respectively renewed. When the time presented is "k", the following equations (2)~(5) individually express such a path-metric corresponding to the path eventually arriving at the state S00 in terms of PM $(00)_k$.

$$PMM(00)_{k+1} = \max \{PMM(00)_k + BM(-2),\ PM(10)_k + BM(-1)\} \quad (2)$$

$$PMM(01)_{k+1} = PMM(00)_k + BM(-1) \quad (3)$$

$$PMM(10)_{k+1} = PMM(11)_k + BM(+1) \quad (4)$$

$$PMM(11)_{k+1} = \max \{PMM(01)_k + BM(+1),\ PM(11)_k + BM(+2)\} \quad (5)$$

The terms "max {X, Y} shown in the above equations (2) and (5) designates that whichever bearing a greater value among the components X and Y has been selected.

In the "Viterbi" decoder shown in FIG. 2, by applying the branch metric (+2), BM (+1), BM (−1), and BM (−2) secured by the above-referred branch-metric computing circuit 105 via adders 110A~110C, 120A~120C, comparators 112 and 122, selectors 113 and 123, and also by applying the values PMM (11), PMM (10), PMM (01), and PMM (00) stored in the corresponding domains of the above-referred path-metric memory 130, arithmetic operations are executed as per the above equations (2)~(5), whereby renewing the contents of the path-metric memory 130.

For example, initially, data outputted from the adders 110A and 110B are compared with each other by the comparator 112, and then, based on the compared result, either of the outputs from the adders 110A and 110B is selected by the selector 113, whereby the above equation (5) can be formulated. Likewise, the above equation (2) can be formulated by way of executing such processes for initially comparing outputs from the adders 120A and 120B via the comparator 122, and then, based on the compared result, the selector 123 selects either of outputs from the adders 120A and 120B.

Whenever renewing values of PMM (00) and PMM (11), the comparators 112 and 122 individually select either of the two candidate values whichever the one bearing a greater path-metric value. By way of repeating the act of selection, an identical path among plural paths individually arriving at four conditions is shared by the decoding system at a specific moment after a certain time is elapsed. The shared path portion corresponds to the one evaluated to be the most probable by the "Viterbi" decoder 100. Concurrently, based on the result selected by the comparators 112 and 122, the remaining paths are memorized by a path memory 140, and then, certain binary data corresponding to the remaining paths are outputted from the path memory 140.

In addition, after continuously renewing the memory contents of the path-metric memory 130 in compliance with the above equations (2)~(5), values of the path-metric tend to rise as a whole. As a result, it is required to provide a certain system to prevent the stored contents of the path-metric memory 130 from being overflowed. Although there are some proposals on this mechanism, inasmuch as this system is not directly related to the essentials of the present invention, further description will be omitted.

In the "Viterbi" decoder shown in FIG. 2, as described above, data outputted from the adders 110A and 110B are transmitted to the comparator 112 and a differentiator 111. Then, the differentiator 111 computes differential component between data outputted from the adders 110A and 110B, in other words, it computes such a differential value compared by the comparator 112. The differential value computed by the differentiator 111 is then outputted as the difference (11) of the path-metric. Likewise, data outputted from the adders 120A and 120B are transmitted to the comparator 122 and another differentiator 121. Then, the differential component between data outputted from the adders 120A and 120B, in other words, such a differential value compared by the comparator 122, is then outputted as the difference (00) of the path metric. These differential values (11) and (00) are respectively utilized for computing the above SAM values.

In advance to describing a practical configuration of the SAM value computing unit, first an algorithm utilized for the computation of the SAM values is described below. As described above, the term "SAM" cited here designates the difference between such path metric of the data array which is judged by the "Viterbi" decoder to be most likely and such path metric of the data array judged by the "Viterbi" decoder to be erroneous. When 2-bits of the data array outputted from the "Viterbi" decoder 100 turn out to be 0→0, the state on the corresponding trellis should have been shifted to S00→S00 or S10→S00. For example, in the event that such a path passing through the state S00 has been selected, it implies that it has already been judged whether the present state was shifted from the state S00 or from the state S10. Concurrently, the difference in the path metric considered as its basis corresponds to (00). Likewise, in the event that 2-bits of the data array turn out to be 1→1, difference of path metric for constituting basis for the selection of path corresponds to (11).

On the other hand, for example, when 2-bits of data array remain in the state 0→1, this corresponds to such a condition in which the state has been shifted to S00→S01, and thus, the path passing through the state S01 has no alternative for selection, whereby compulsorily passing through the states S00→S01→S11. In a similar way, in the event that 2-bits of data array remain in the state 1→0, the path has no room of selection whereby compulsorily passing through the states S11→S10→S00. In summary, it is so arranged that the SAM values may be outputted in correspondence with a data array as shown in FIG. 3.

Figure 4:
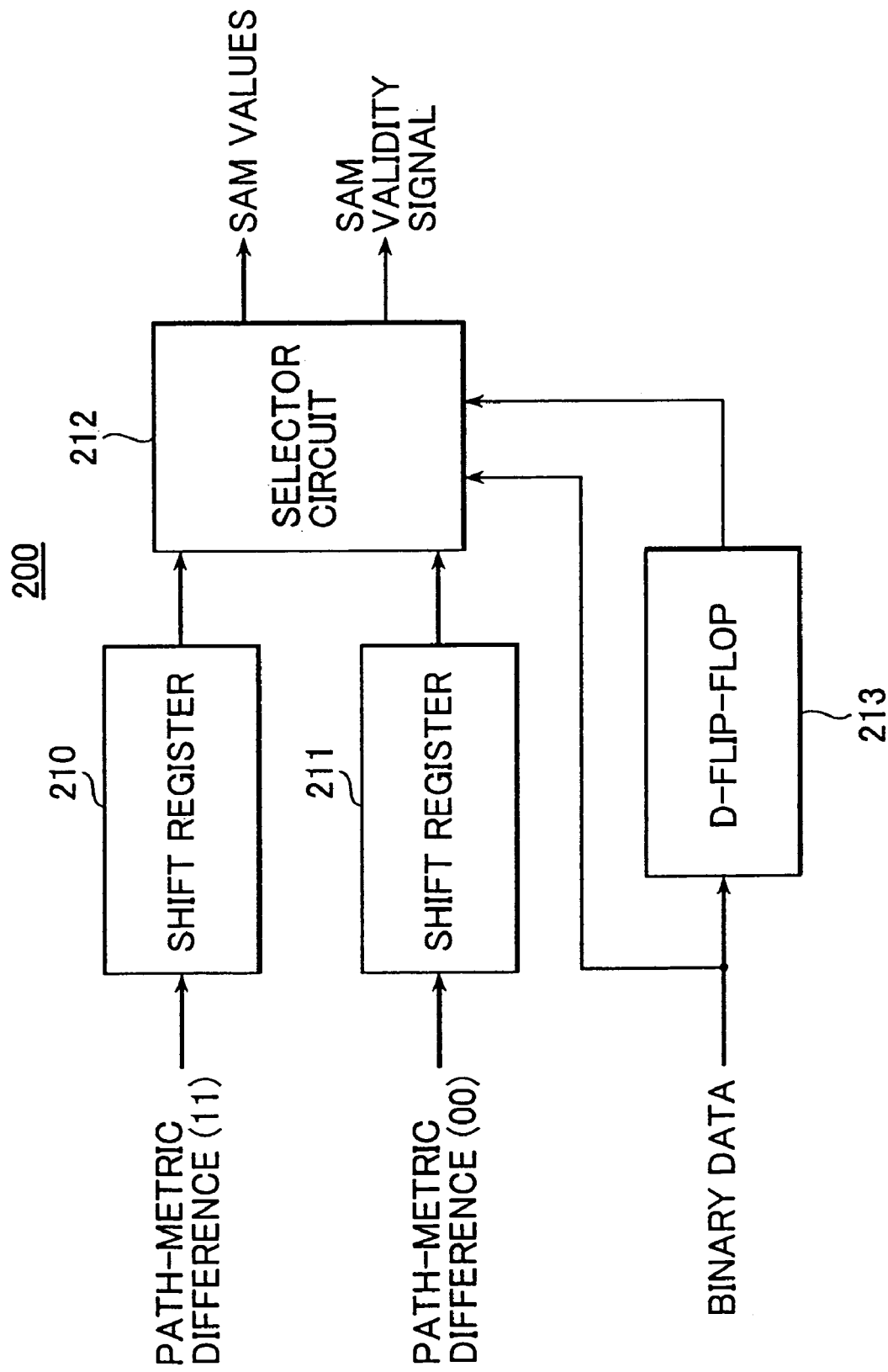
FIG. 4 shows a simplified block diagram that exemplifies a structure of the SAM computing system according to a preferred embodiment of to the present invention.

FIG. 4 exemplifies a schematic block diagram of the SAM value computing unit 200. In FIG. 4, differential values (11) and (00) of the path metric outputted from the "Viterbi" decoder 100 are individually input into a pair of selective input terminals of a selector circuit 212 via a pair of registers 210 and 211. These registers 210 and 211 individually compensate the difference between the timing of computing the differential values (00) and (11) and the timing to effect output of binary data.

On the other hand, binary data outputted from the path memory 140 of the "Viterbi" decoder 100 is input into the selector circuit 212 in conjunction with such a value signal which is delayed by 1-clock by a D-flip-flop circuit 213. In accordance with such an arrangement shown in FIG. 3 and based on the data arrangement shown as binary data, the selector circuit 212 selects the path-metric differential values (11) and (00) and then outputs both values as the SAM values. Also, the selector circuit 212 outputs a SAM validity signal for identifying actual validation or invalidation of the SAM values. For example, when the SAM values are valid, the SAM validity signal turns to a "High level" status, where, if the SAM values are invalid, the SAM validity signal turns to a "Low level" status.

Moreover, when modulation codes used in a recording and reproducing system do not have a run limit, SAM values corresponding to an ideal signal remain constant regardless of the pattern of data array. On the other hand, as degradation of a reproducible signal proceeds, the SAM values are subject to greater dispersion Further, it is known that, irrespective of the degree of the degradation of reproducible signal, the mean SAM value approximates to such a SAM value compatible with ideal signal. As a result, in the above recording and reproducing systems, by way of statistically computing dispersion or standard deviation of the SAM values, as in the case of with reference to jitter component in the reproduction system utilizing detection of the threshold value, it is possible to utilize the mean SAM value as a reference evaluation value in the reproduction system using a maximum likelihood decoder.

On the other hand, when operating such a reproduction system utilizing a maximum likelihood decoder compatible with such modulation codes with run limit, such SAM values compatible with ideal signal are variable depending on data pattern. As a result, even when computing dispersion of the SAM values, the resultant values cannot effectively be utilized as the value for evaluating actual quality of the reproduced signal. Also, most of such maximum likelihood decoders compatible with modulation codes having run limit are effective only for limitation of minimum run.

According to the present invention, by way of solely extracting such values within a restricted range among the computed SAM values and then executing a predetermined statistical process against the extracted SAM values, it is possible to secure such values suitable for evaluation of reproduced signal. In other words, in order to select SAM values, such values are selected, which comprise the one below the minimum of the SAM values for ideally-reproduced signal, and then, such a value suitable for evaluation of reproduced signal is secured by way of computing an average value of the square of the differential value between the minimal SAM value for an ideally-reproduced signal and the selected SAM values.

Figure 5:
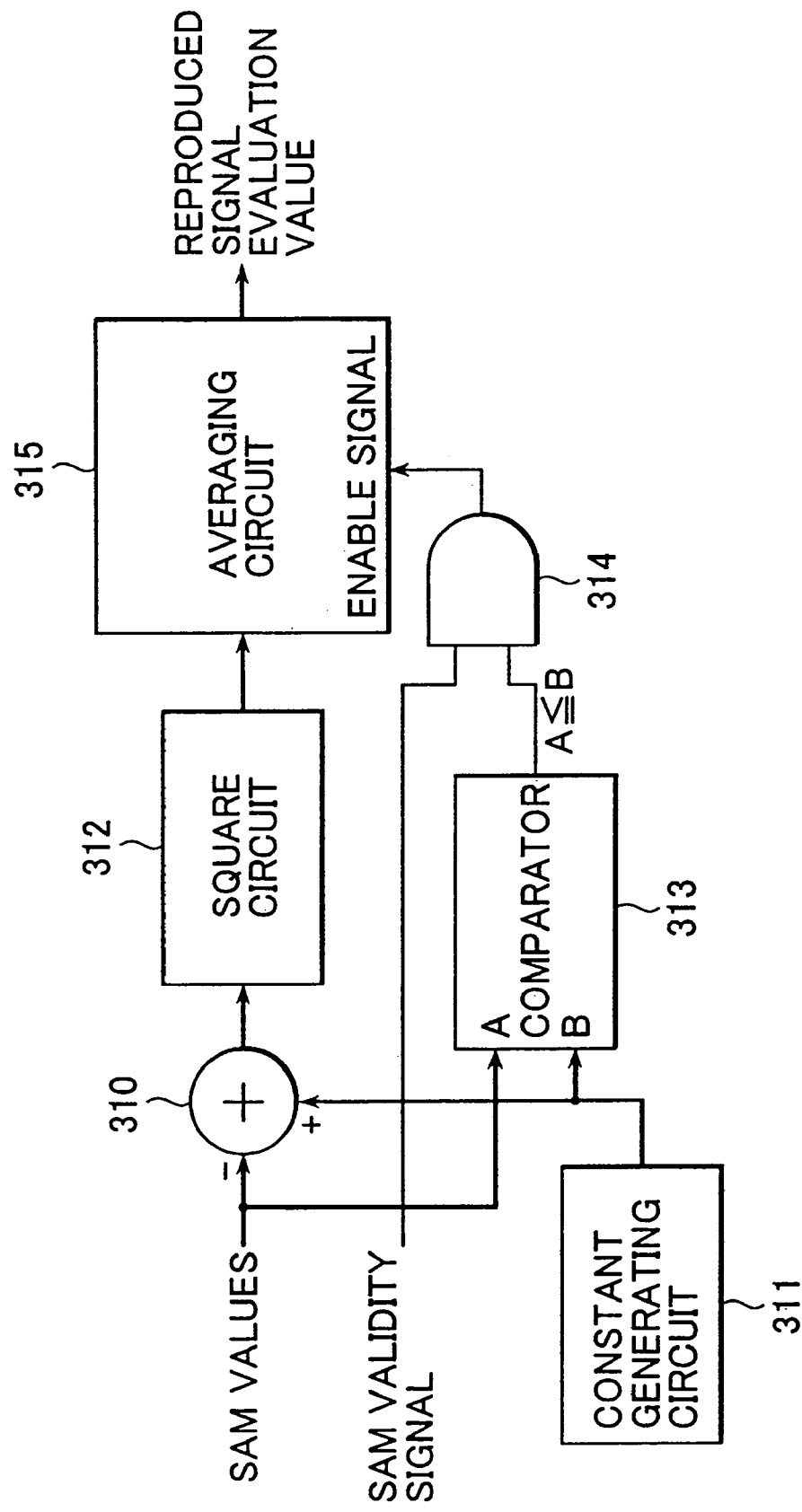
FIG. 5 shows a simplified block diagram that exemplifies a structure of the evaluation value computing circuit according to a first preferred embodiment of the present invention.

FIG. 5 exemplifies a schematic block diagram of an evaluation value computing circuit 300 for computing such values for evaluation of reproduced signal from the SAM values outputted from the SAM value computing unit 200. A constant generating circuit 311 generates the minimal SAM value for an ideal reproduced signal. For example, in the case of utilizing such a "Viterbi" decoder conforming to the trellis diagram shown in FIG. 1, the minimal SAM value for an ideally-reproduced signal becomes 6. Such a SAM value outputted from the selector circuit 212 of the SAM value computing unit 200 and the minimal SAM value for an ideally-reproduced signal generated by the above constant generating circuit 311 are individually input into each of a pair of input terminals of a subtracting unit 310.

After subtracting the SAM values from the minimal SAM value outputted from the constant generating circuit 311, the differential value outputted from the subtracting unit 310 is squared by a square circuit 312, and then transmitted to an averaging circuit 315. While "enable" signal transmitted from an AND circuit 313 remains "High", the averaging circuit 315 averages the squared values outputted from the square circuit 312. An average value outputted from the square circuit 312 is then outputted from the averaging circuit 315 as the value for evaluating actual quality of reproduced signal.

It is allowable for the averaging circuit 315 to compute an average value by way of averaging the squared values outputted from the square circuit 312 within a predetermined period of time or by way of averaging the squared values outputted from the square circuit 312 corresponding to the predetermined number of samples. It is also allowable for the averaging circuit 315 to compute the mean value of the shift of squared values outputted from the square circuit 312.

On the other hand, the SAM values and the minimal SAM value outputted from the constant generating circuit 311 are compared with each other by the comparator 313. Compared data outputted from the comparator 313 is then inputted into one of input terminals of the AND circuit 314. On the other hand, the above-referred SAM validity signal outputted from the selector circuit 212 of the SAM value computing unit 200 is supplied to the other input terminal of the AND circuit 314. If the result of the comparative process executed by the comparator 313 turns out to be (SAM values)$\leq$ (minimal SAM value outputted from the constant generating circuit 311), then, the comparator 313 outputs "High" signal.

Accordingly, when the SAM validity signal turns "High" for designating that the SAM values are valid, and yet, insofar as the above condition (SAM values)$\leq$(minimal SAM value outputted from the constant generating circuit 311) is met, the "enable" signal outputted from the AND circuit 314 turns "High", whereby enabling the averaging circuit 315 to average the squared values outputted from the square circuit 312.

In addition, if the SAM values exceed the minimal SAM value outputted from the constant generating circuit 311, the "enable" signal turns "Low", whereby the squared values outputted from the square circuit 312 are ignored. As a result, when this condition is present, it is not necessary to execute a square computation correctly.

Figure 6:
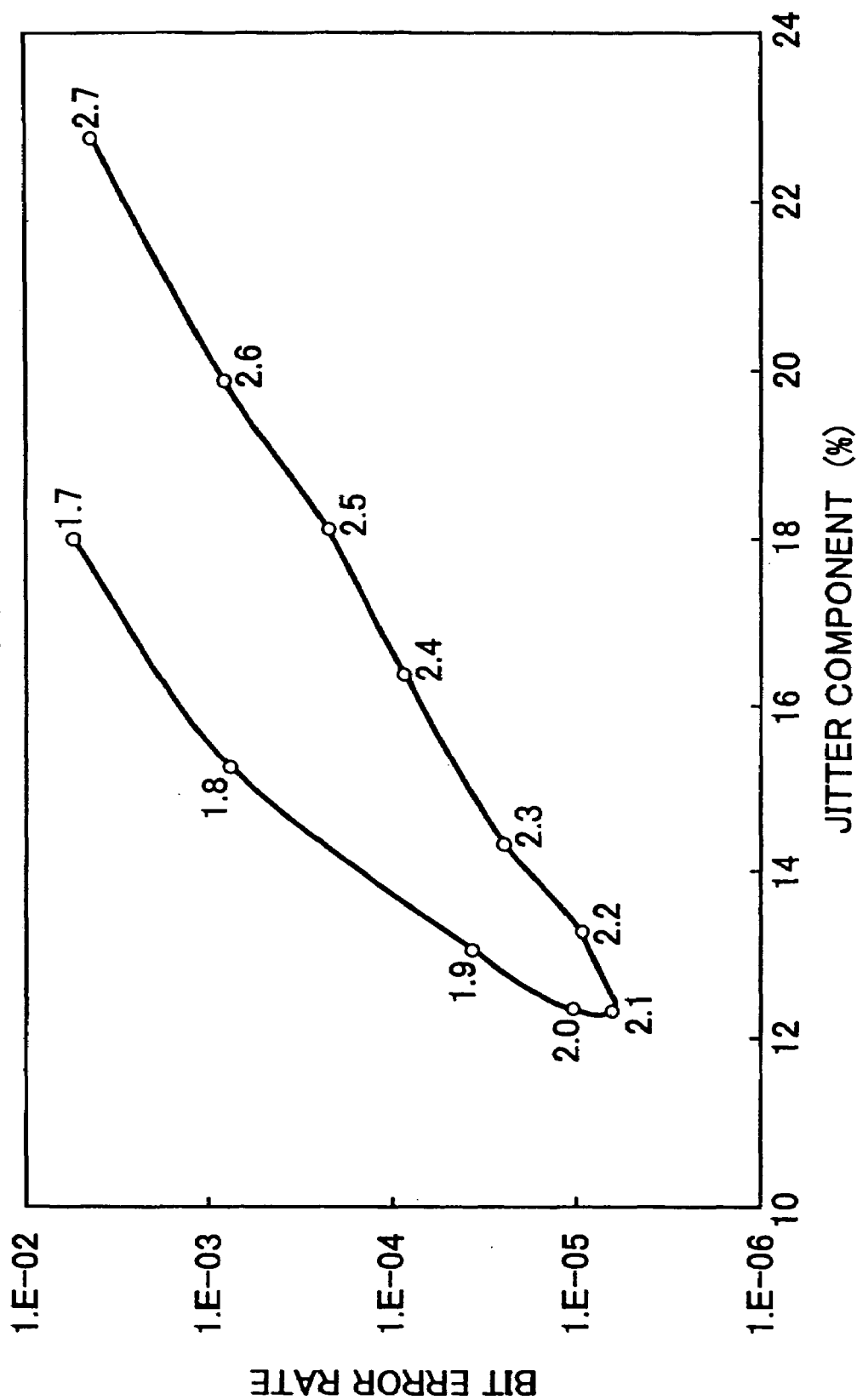
FIG. 6 shows a graphic representation that exemplifies a correlation between the reproduced signal evaluation values and bit error rate when utilizing a jitter component as a value for evaluation of reproduced signal according to the first preferred embodiment of the present invention.
Figure 7:
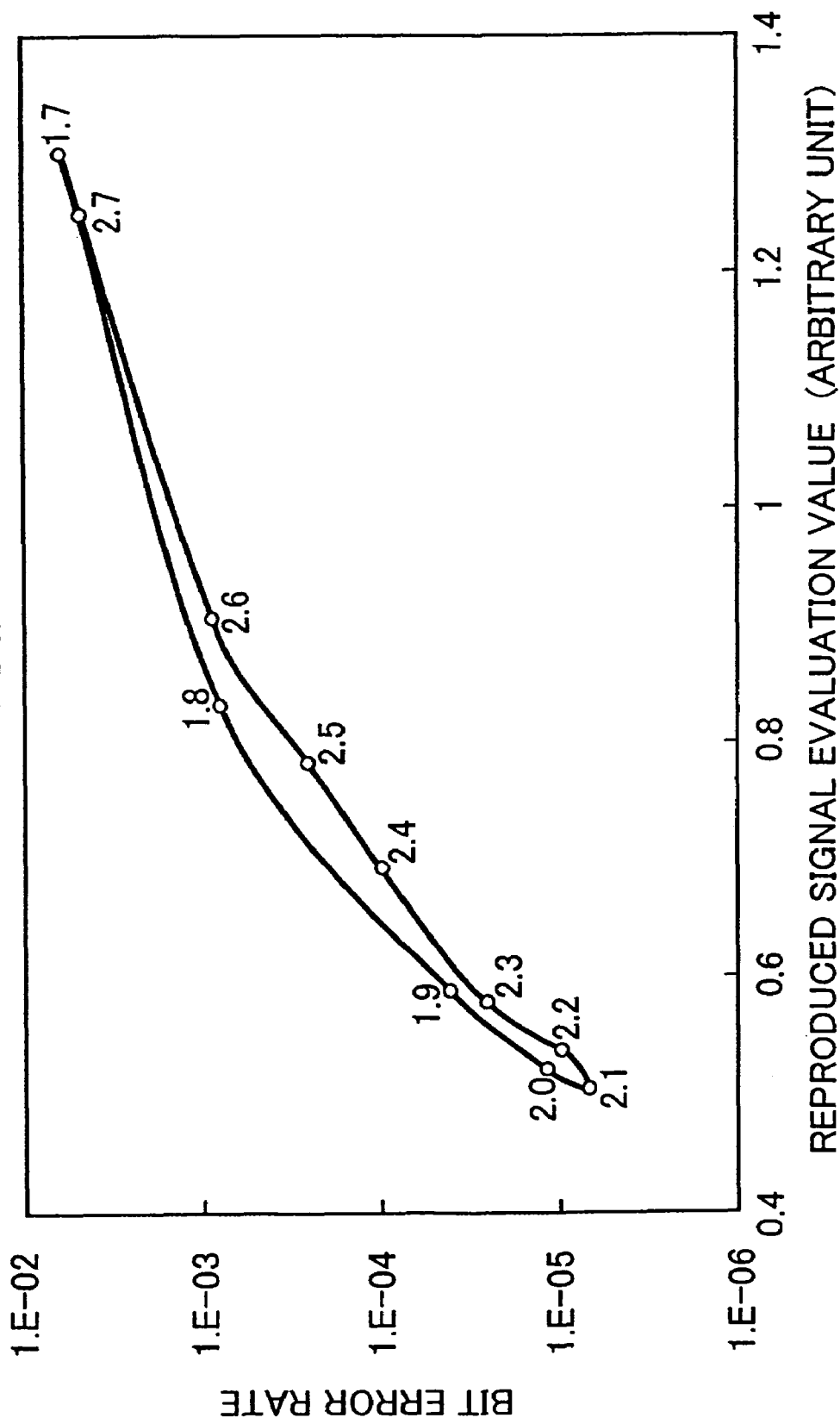
FIG. 7 shows a graphic representation that exemplifies a correlation between the reproduced signal evaluation value and a bit error rate when utilizing such values according to the first preferred embodiment of the present invention as the value for evaluation of reproduced signal.

FIG. 6 and FIG. 7 individually designate the result of comparative experiments by way of using a jitter component as a conventional value for evaluation of reproduced signal described earlier in regard to the prior art in contrast with utilization of the evaluation value in accordance with the first preferred embodiment of the present invention. Specifically, FIG. 6 exemplifies the correlation between the value for evaluation of reproduced signal and the bit error rate when utilizing jitter component for constituting the value for evaluation of reproduced signal. FIG. 7 exemplifies the correlation between the value for evaluation of reproduced signal and the bit error rate of the reproduced signal in accordance with the first preferred embodiment of the present invention.

The reproduction apparatus utilized for implementing the above experiments applied such a magnetic super resolution magneto-optical disc as a recording medium. In this case, bit error rate greatly depends on the reproducing laser power. Experiments were executed by way of checking the correlation between the error rate and the value for evaluation of reproduced signal while varying the reproducing laser power. Numerical values put beside the data points shown in FIG. 6 and FIG. 7 designate the intensity of reproducing laser power.

With reference to the case of applying a jitter component to constitute the value for evaluation of reproduced signal shown in FIG. 6, it is found that the correlation between the value for evaluation of reproduced signal and the bit error rate is less than that is shown in FIG. 7. When adjusting the reproduction apparatus in order to minimize the jitter component, it generates a certain deviation from the condition necessary to minimize the bit error rate. In contrast with the above case, it is found that the value for evaluation of reproduced signal conforming to the first preferred embodiment of the present invention shown in FIG. 7 provides such a correlation between the reproduced signal evaluation value and the bit error rate being greater than that of the comparative case shown in FIG. 6 throughout the entire measuring range. As a result, by way of properly adjusting the reproduction system in order that the reproduced signal evaluation value can be minimized, it is possible to minimize the bit error rate.

Next, an example of variation of the first preferred embodiment of the present invention is described below. When realizing this example of variation, in order that the appearance-frequency of such a value below the minimal SAM value for the ideally-reproduced signal in the input SAM values can exactly correspond to the appearance-frequency of the minimal SAM value for the ideally-reproduced signal, the input SAM values are multiplied by a coefficient. By way of applying such a process similar to the one explained earlier for the first preferred embodiment by with reference to FIG. 5 in order to constitute newly corrected SAM values added with the coefficient-multiplied input SAM values, it is possible to generate such a still higher correlation between the reproduced signal evaluation of signal and the bit error rate.

Figure 8:
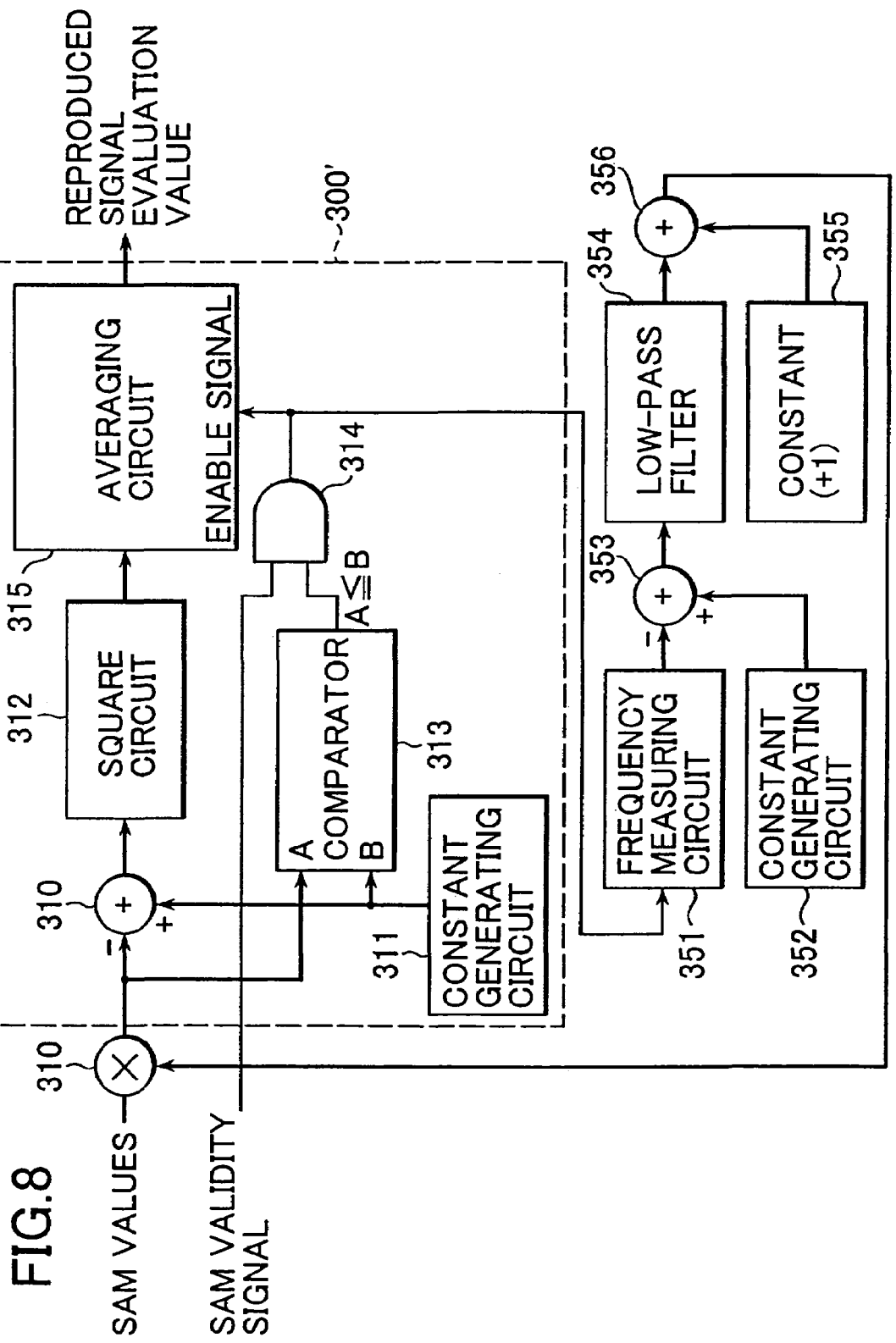
FIG. 8 shows a schematic block diagram that exemplifies a structure of the evaluation value computing circuit according to a variation of the first preferred embodiment of the present invention.

FIG. 8 exemplifies a schematic block diagram of an evaluation value computing circuit 300' according to a variation from the first preferred embodiment of the present invention. Unlike the preceding evaluation value computing circuit 300 according to the first preferred embodiment described above, the evaluation value computing circuit 300' of the variation example multiplies the input SAM values by the coefficient based on the "enable" signal. Those components shown in FIG. 8 corresponding to those shown in FIG. 5 are designated by identical reference numerals, so that further description of the same numerals will be omitted.

The SAM values outputted from the SAM computing system 200 are supplied to a multiplier 350 and multiplied by a coefficient, then transmitted to the evaluation value computing circuit 300', and, as described earlier by with reference to FIG. 5, supplied to a subtracting unit 300 and a comparator 313 inside the evaluation value computing circuit 300'.

Such a coefficient applicable to multiplication against the inputted SAM values via the multiplier 350 is obtained by way of the following: the coefficient to be inputted to the multiplier 350 is controlled by applying a feed-back process in order that the frequency of such processes for averaging signals outputted from the square circuit 312 via the averaging circuit 315 effectuated by "enabling" signal may remain constant.

More specifically, data outputted from the AND circuit 314 are transmitted to the frequency measuring circuit 351, in which data outputted from the AND circuit 314 turns "High", and then, rounds of frequency for enabling the averaging circuit 315 are measured. Next, signals for designating the measured frequency are supplied to a subtracting unit 353, in which a target frequency outputted from a constant generating circuit 352 is subtracted from the measured frequency. The target frequency corresponds to the frequency of appearance of the minimal SAM values for the ideally-reproduced signal, and yet, the target frequency constitutes previously established values computed from simulation. The output from the subtracting unit 353 is then supplied to an adder 356 via a low-pass filter 354, then a constant [1] outputted from a constant generating circuit 355 is added, whereby constituting a coefficient against the multiplier 350.

Figure 9:
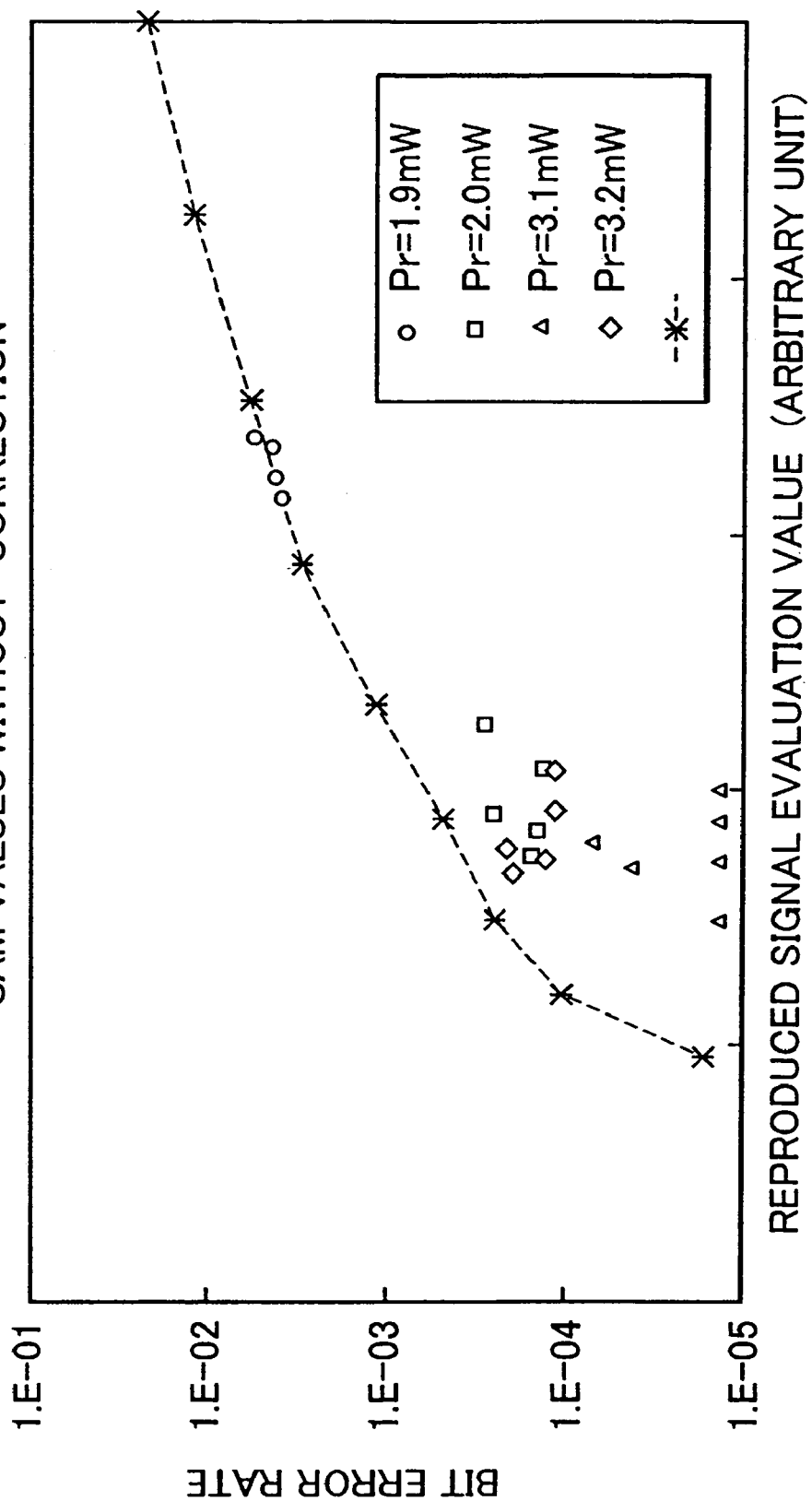
FIG. 9 shows a graphic representation that exemplifies a correlation between the reproduced signal evaluation value and the bit error rate according to the first preferred embodiment of the present invention.
Figure 10:
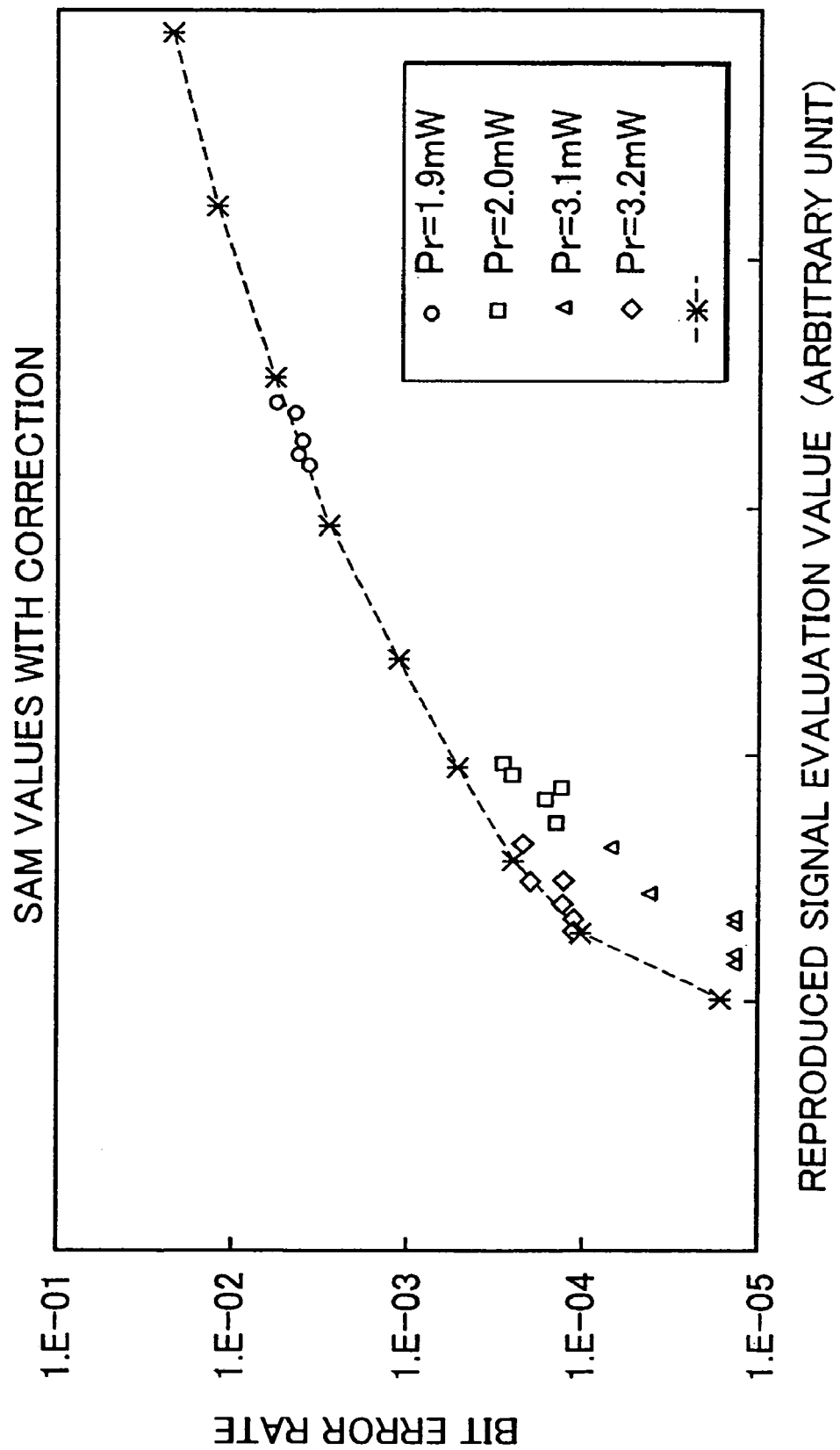
FIG. 10 shows a graphic representation that exemplifies a correlation between the reproduced signal evaluation value and the bit error rate according to a variation of the first preferred embodiment of the present invention.

FIG. 9 and FIG. 10 designate an example of correlation between the reproduced signal evaluation value and the bit error rate based on the above-referred first preferred embodiment and the variation example of the first preferred embodiment of the present invention. FIG. 9 designates the result of experiments executed as per the first preferred embodiment of the present invention, in which correction of the SAM values applied to the variation example of the first preferred embodiment is not performed. FIG. 10 designates the result of experiments according to the variation example of the first preferred embodiment of the present invention in which correction the SAM values is performed. Like the preceding experiments shown in FIG. 6 and FIG. 7, in the experimental result shown in FIG. 10, the reproduction apparatus applies such a magnetic super resolution magneto-optical disc. In the present experiment, the reproduced signal evaluation value and the bit error rate were measured by way of varying the reproducing laser power Pr. Further, by way of varying frequency characteristics of an equalizer of an electrical circuit of the reproduction apparatus, such experimental values were obtained under various reproducing conditions.

Such data designated as "computation" shown in FIG. 9 and FIG. 10 represents a relationship between the reproduced signal evaluation value and the bit error rate when adding white noise component to the ideally-reproduced signal by means of computer simulation. It has been found that the result of correction of the SAM values shown in FIG. 10 is compatible with the result of the computer simulation, and yet, correlation between the reproduced signal evaluation value and the bit error rate has evidently been increased compared to the result without correction of the SAM values shown in FIG. 9.

Figure 11:
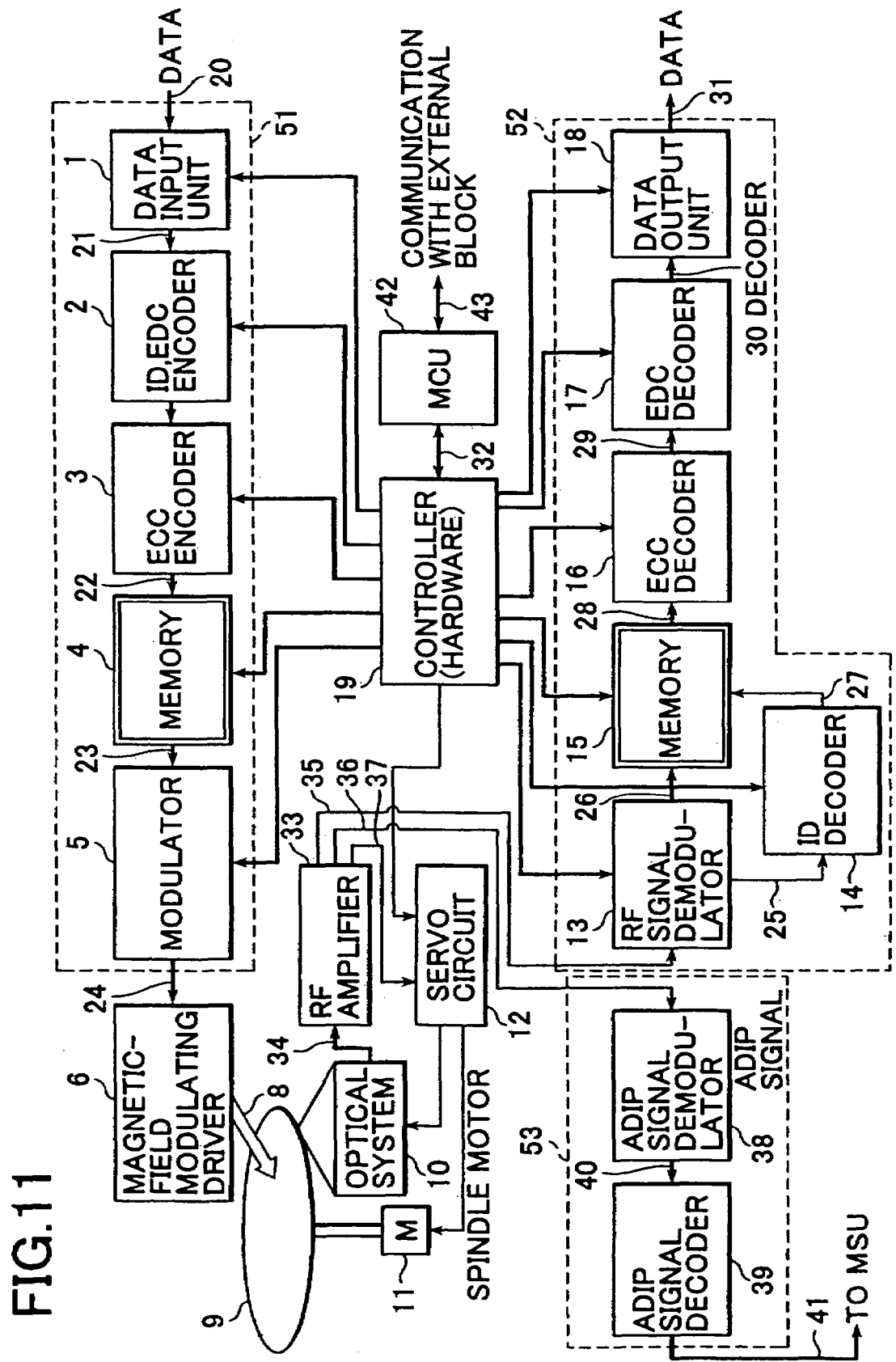
FIG. 11 shows a schematic block diagram that exemplifies a structure of a recording/reproducing apparatus applicable to the first preferred embodiment and a variation of the first preferred embodiment of the present invention.

Next, a second embodiment of the present invention is described below. The second embodiment includes another example of the first preferred embodiment and another example of the variation from the first preferred embodiment of the present invention. FIG. 11 designates an overall schematic block diagram of an example of the recording and reproducing apparatus based on the second embodiment of the present invention. This recording and reproducing apparatus includes an encoder 51, a magnetic head 8 which generates magnetic field on the signal recording surface of an magneto-optical disc 9, and a magnetic field modulating driver 6 which generates modulated magnetic field on the magnetic head 8 based on signal 24 supplied from the encoder 51.

The encoder 51 is used for a process for encoding data when recording. The encoder 51 includes the following: a data input unit 1 which applies a predetermined process to data inputted via an external source, an ID-EDC encoding unit 2 which encodes data 21 supplied from the data input unit 1 with an ID code and an error detecting code EDC, an ECC encoding unit 3 which encodes data from the ID-EDC encoding unit 2 with an error correcting code ECC, a memory 4 which stores an encoded data 22 supplied from the ECC encoding unit 3, and a modulator 5 which modulates signal 23 supplied from the memory 4 into a predetermined format.

Initially, data 20 supplied from an external block (not shown) is inputted into the data input unit 1. Next, the data 20 is outputted from the data input unit 1 as data 21 for delivery to the ID-EDC encoding unit 2. On receipt of this data 21, the ID-EDC encoding unit 2 adds such an EDC signal to the data 21 in order to check an ID code to be recorded on the magneto-optical disc 9 and also check reproduced signal while recording process is proceeded.

Next, output from the ID-EDC encoding unit 2 is supplied to the ECC encoding unit 3, a parity for error correction is added thereto, and then, outputted to the memory 4 as data 22. The data 22 is provisionally being stored in the memory 4 and freed from deviation of time caused by transmission from an external block and execution of the above processes. Such a renewed signal 23 freed from deviation of time is then read out from the memory 4 by the modulator 5.

The modulator 5 modulates and outputs the signal 23 into a signal 24 available for recording onto the magneto-optical disc 9. For example, by applying a modulation codes having a minimum run of 1 or more, the modulator 5 modulates the signal 23 into a modulated signal 24, which is then transmitted to the magnetic-field modulating driver 6. On receipt of the modulated signal 24, the magnetic-field modulating driver 6 drives the magnetic head 8 to generate such magnetic field enough to record the modulated signal 24 on the magneto-optical disc 9, and finally enables the modulated signal 24 to be recorded on the magneto-optical disc 9.

In addition, the recording and reproducing apparatus based on the second embodiment of the present invention further includes the following: a spindle motor 11 for rotatably driving the opt-magnetic disc 9, an optical system 10 for condenses and irradiates laser beams onto the signal-recording surface of the magneto-optical disc 9 and then receives reflected beams, an RF amplifier 33 which amplifies RF signal transmitted from the optical system 10, and a servo circuit 12 which applies servo operation to the optical system 10 and the spindle motor 11 based on the signal from the RF amplifier 33.

First, modulated data recorded on the magneto-optical disc 9 is read by the optical system 10 and then transmitted to the RF amplifier 33 as a reproducible signal 34. Based on the received reproducible signal 34, the RF amplifier 33 generates such an ADIP (ADdress In Pre-groove) signal 36 pertaining to a wobbling address allocated in the magneto-optical disc 9, and yet, it also generates such servo-error signal 37 pertaining to focusing error and tracking error. These signals generated by the RF amplifier 33 are then transmitted to a servo circuit 12, an RF signal demodulator 13, and an ADIP signal demodulator 38.

In order to properly condition the reproducible signal, the servo circuit 12 controls operation of the optical system 10 and the spindle motor 11. The spindle motor is so controlled that the magneto-optical disc 9 is controlled based on a proper number of rotations (revolutions).

In addition, the recording and reproducing apparatus based on the second embodiment further includes a decoder 52 for decoding RF signal 35 outputted from the RF amplifier 33 and an ADIP signal processor 53 for processing the ADIP signal 36 outputted from the RF amplifier 33.

The decoder 52 is utilized for decoding process for reproduction and includes the following: an RF signal demodulator 13 which demodulates the RF signal 35 amplified by the RF amplifier 33, an ID decoder 14 which decodes ID codes based on a data 25 supplied from the RF signal demodulator 13, and a memory 15 which stores a data 26 supplied from the RF signal demodulator 13 and a data 27 from the ID decoder 14.

The RF signal demodulator 13 demodulates the RF signal 35 by way of executing a process that is inverse of that is executed by the modulator 5. Signals 25 and 26 are obtained from the demodulated RF signal 35 after demodulation via the RF signal demodulator 13, and then respectively transmitted to the ID decoder 14 and the memory 15.

The ID decoder 14 detects such ID codes added by the ID-EDC encoder 2 out from the signal 25 outputted from the RF signal demodulator 13. Based on the detected ID codes, an address 27 is determined in order to store the data 26 outputted from the RF signal demodulator 13 into the memory 15.

The above-referred decoder 52 further includes an ECC decoder 16 for decoding the error correcting code ECC out from a data 28 read out from the memory 15; an EDC decoder 17 for decoding the error detecting code EDC out from a data 29 comprising a decoded ECC data outputted from the ECC decoder 16; and a data output unit 18 for initially executing a predetermined process against a data 30 comprising a decoded EDC code outputted from the EDC decoder 17 and then externally outputs the processed data as a data 31.

After being outputted from the RF signal demodulator 13 and then provisionally stored in the memory 15 according to the address 27, the signal 26 is read out by the ECC decoder 16 as a data 28. The error correcting code ECC borne by the data 28 is decoded by the ECC decoder 16 whereby correcting error, and then the data 28 is transmitted to the EDC decoder 17. On receipt of this data 28, the EDC decoder 17 checks whether the data 29 is correct or not. The data 30 including the verified data 29 is then transmitted to the data output unit 18, and then further transferred to an external block (not shown) as an output data 31.

An ADIP signal processor 53 is provided for facilitating recording or reproducing operation, which comprises the following: an ADIP signal demodulator 38 for demodulating an ADIP signal outputted from the RF amplifier 33, and an ADIP decoder 39 for decoding the ADIP signal from a data 40 comprising a demodulated ADIP signal outputted from an ADIP signal demodulator 38.

By way of demodulating the ADIP signal via the ADIP demodulator 38, such a signal 40 is generated, which includes arrays of data aligned on an magneto-optical disc. Further, by way of checking error against the signal 40 via the ADIP decoder 39, an address data 41 is generated. The address data 41 is transmitted to an MCU 42, where the address data 41 is utilized as standard data for the recording and reproducing process.

The recording and reproducing apparatus further includes a controller 19 for controlling all the operating components and an MCU 42 for controlling the controller 19. Based on communication (43) with an external block 19, the MCU 42 outputs an instruction to the controller 19. The controller 19 constituted as hardware transmits fine timing signals to each component blocks based on the controlling signal from the MCU 42.

In the above-described recording and reproducing apparatus, such a construction according to the first preferred embodiment and a variation example from the first preferred embodiment of the present invention is applied to the above-referred RF signal demodulator 13 for example. In other words, the RF signal demodulator 13 comprises a "Viterbi" decoder 100, a SAM value computing unit 200, and an evaluation value computing circuit 300. A reproduced signal 34 reproduced from an magneto-optical disc 9 via an optical system 10 is amplified into a predetermined amplitude by the RF amplifier 33 to become an RF signal 35, and then, the RF signal 35 is supplied to the RF signal demodulator 13. The RF signal 35 is supplied to the "Viterbi" decoder 100, which then decodes the RF signal 35 into binary data. The decoded binary data array is stored in the memory 15, for example.

On the other hand, path-metric difference values (00) and (11), and binary data generated by the "Viterbi" decoder 100 are respectively transmitted to the SAM value computing unit 200, then SAM values and SAM validity signals are obtained. The SAM value and the SAM validity signal are then supplied to the evaluation value computing circuit 300, which then generates reproduced signal evaluation values via the above-described processes. The reproduced signal evaluation values are supplied to the controller 19 for example. Based on the received reproduced signal evaluation values, in order that intensity of laser power (reproducing power) emitted from the optical system 10 can be optimized, the controller 19 transmits a controlling signal to the servo circuit 12.

In addition, the above construction can be applied not only for the period of reproducing a signal from the magneto-optical disc 9, but it is also applicable when recording data onto the magneto-optical disc 9. In the case of the recording process, immediately after recording data onto the magneto-optical disc 9 via the magnetic head 8, recorded data is reproduced via the optical system 10, whereby generating the reproduced signal evaluation values via the above processes. By way of controlling the magnetic-field modulating driver 6 based on the reproduced signal evaluation values, it is possible to optimize intensity of the recording power, whereby properly controlling the recording of data against the magneto-optical disc 9.

With reference to the case of applying the present invention to the recording and reproducing a signals, a practical controlling method is described in detail below. It has to be observed that the following description will refer to the reproduced signal evaluation values computed by reference to the SAM values in the above-referred first preferred embodiment simply as the SAM values, as a matter of convenience. In the second embodiment, a reference value $SAM_{th}$ of predetermined SAM values is previously established, and then compares the SAM values generated at the time of recording or reproducing a signal to the reference value $SAM_{th}$. As a result of comparison, among the reproducing or recording power obtained when in the reproduction process or recording process below the reference value $SAM_{th}$, such a value generated by way of multiplying the lowest power value $P_{th}$ by a predetermined coefficient is determined as the reproducing power or the recording power.

When the above condition occurs, inasmuch as the reference value $SAM_{th}$ does not correspond to such a SAM value for providing the minimal value of error rate, the power value $P_{th}$ also does not provide the minimal value of error rate. However, it is known that, when selecting a proper value as the reference value $SAM_{th}$, there is a predetermined corresponding relationship such as a proportionate relationship for example between the selected reference value $SAM_{th}$ and the optimal power value $P_o$ for minimizing error rate. Based on this reason, by way of multiplying the power value $P_{th}$ computed by with reference to the reference value $SAM_{th}$ by a predetermined coefficient, it is possible to secure the optimal power value $P_o$. Such an optimal corresponding relationship between the reference value $SAM_{th}$ and the power value $P_{th}$ can be determined via experiments, for example.

Figure 12:
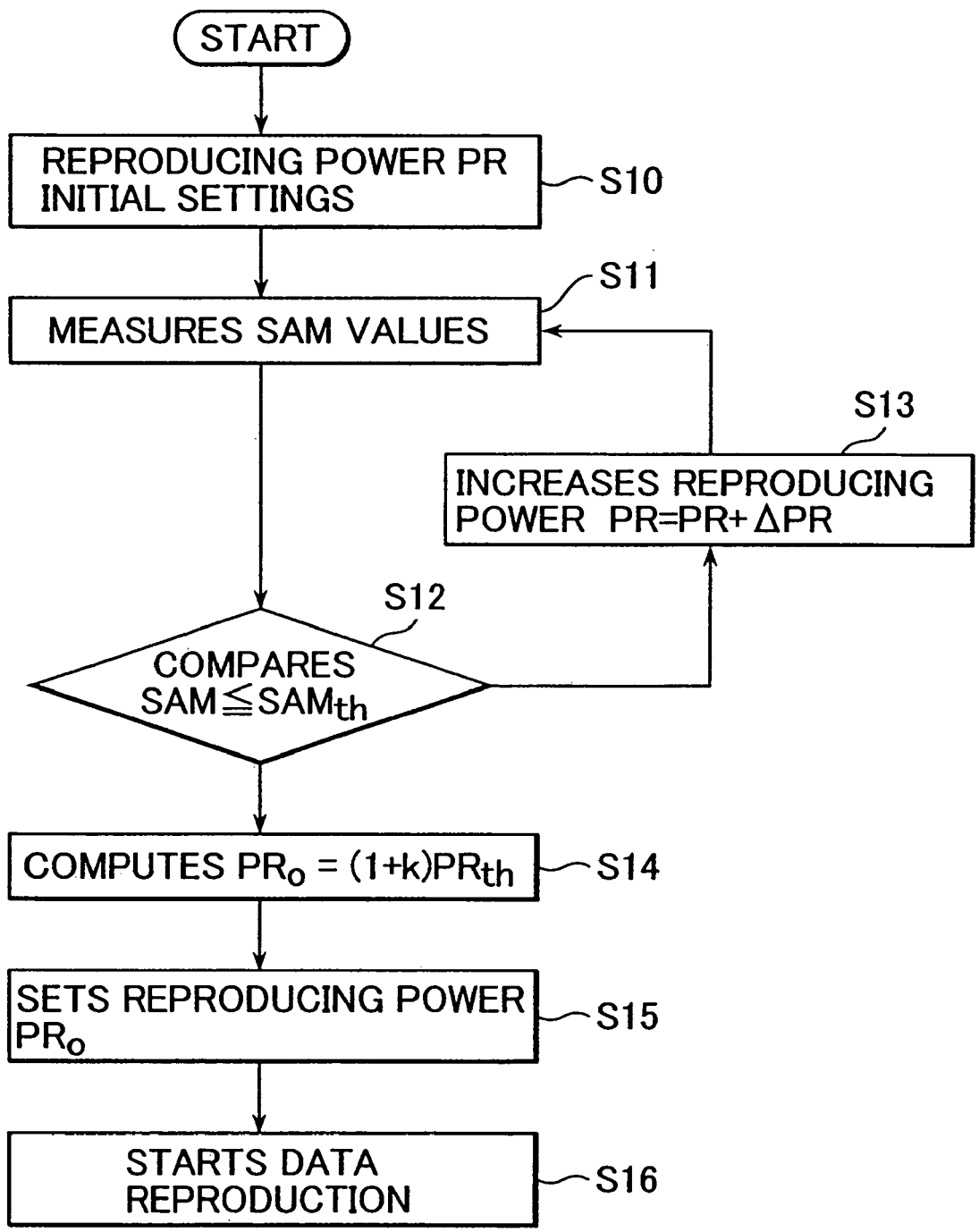
FIG. 12 shows a flowchart that exemplifies a process for setting of reproducing power by utilizing SAM (sequenced amplitude margin) values according to a preferred embodiment of the present invention.

With reference now to FIG. 12, serial processes for controlling in the reproducing operation are described below. FIG. 12 designates such a flowchart that exemplifies serial processes for setting reproducing power by applying the SAM values. While the initial step S10 is underway, reproducing power PR is initialized. When the following step S11 is entered, actual SAM values as of the initially preset reproducing power PR are measured. When the next step S12 is entered, result measured via the preceding step S11 is compared to the predetermined reference value $SAM_{th}$. As a consequence, if it is identified that the result does not coincide with "the measured SAM values≦reference value $SAM_{th}$", in other words, if it is identified that the result corresponds to "SAM value>reference value $SAM_{th}$", then, operation proceeds to step S13, in for reproducing power PR is reinforced. This causes the operating mode to be back to step S11, in which the SAM values are again measured with the increased reproducing power PR.

On the other hand, if it is identified in step S12 that the measured SAM values correspond to "SAM values≦reference value $SAM_{th}$", then, operation proceeds to step S14, in which, by utilizing reproducing power PR corresponding to the measured value shown as "SAM value≦reference value $SAM_{th}$" in step S12 as the power value $PR_{th}$, the power value $PR_{th}$ is multiplied by a value (1+k), where "k" designates a predetermined coefficient. The resultant value $(1+k)PR_{th}$ is then determined as the optimal reproducing power $PR_0$.

Next, step S15 is entered, in which the servo circuit 12 sets the optimal reproducing power $PR_0$ to the optical system 10. When the ensuing step S16 is entered, the optimal reproducing power $PR_0$ activates reproduction of data from the magneto-optical disc 9.

Figure 13:
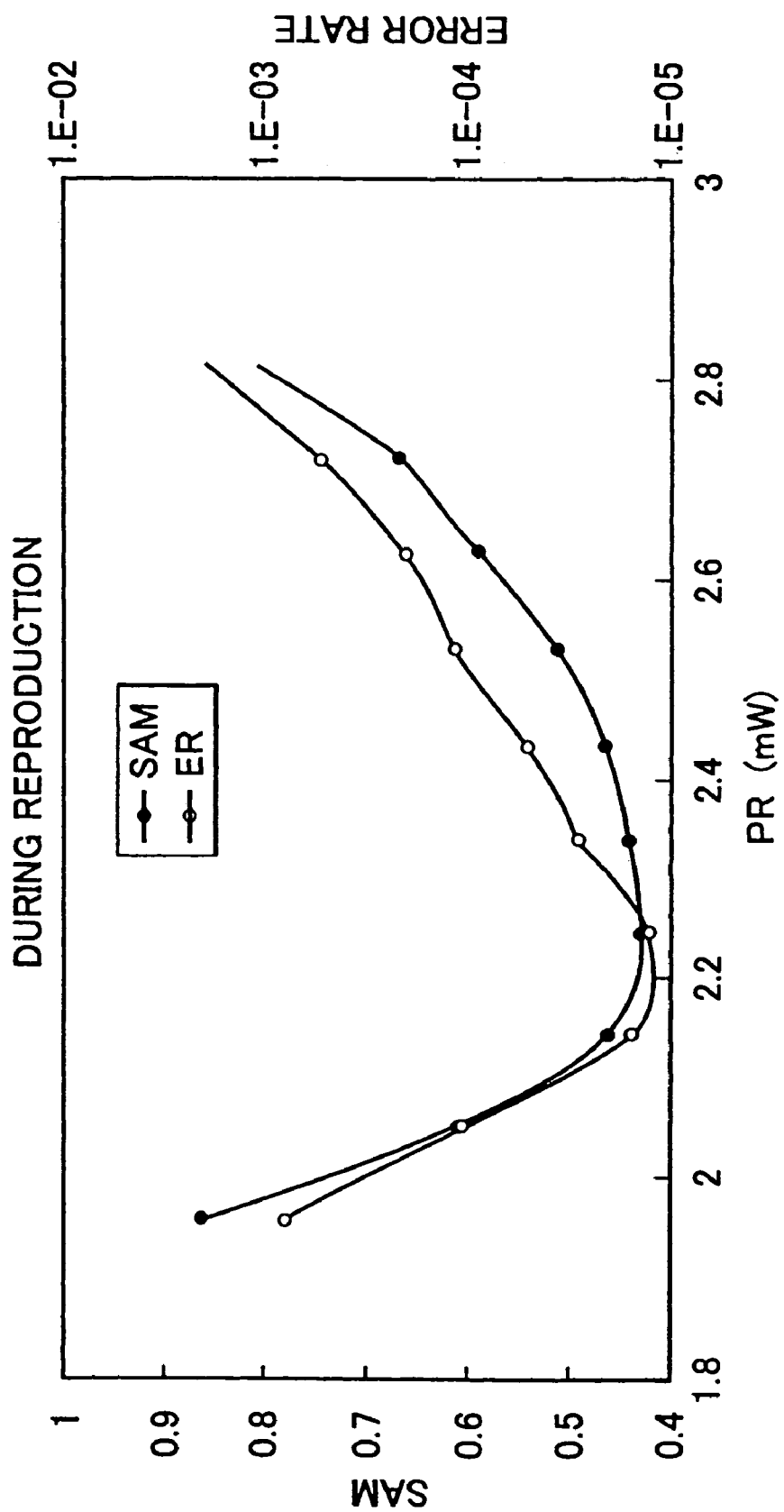
FIG. 13 shows a graphic representation that exemplifies the result of measuring the SAM values and the error rate against the reproducing power PR according to a preferred embodiment of the present invention.

FIG. 13 designates a graphic representation which exemplifies result of measuring of the SAM values against the reproducing power PR and the resultant error rate. It is understood from the chart that there is a certain correlation between the SAM values shown by means of black circles (●) and the error rate shown by means of white circles (○) against the reproducing power PR. For example, when the reference value $SAM_{th}$ is set to be 0.7, the corresponding reproducing power $PR_{th}$ becomes approximately 2.0 mW. On the other hand, the optimal reproducing power for minimizing the SAM values corresponds to approximately 2.2 mW. Accordingly, in the example shown in FIG. 13, based on an equation (1+0.1)×2.0 mW=2.2 mW, it is possible to determine the coefficient "k" as "k=0.1".

When executing the above measurement, it is also conceivable to seek the optimal power value $PR_0$ via measurement of the SAM value by way of shifting the reproducing power PR. However, inasmuch as this method takes a relatively long time until reaching the optimal power value $PR_0$, and yet, inasmuch as the reproducing power PR must be shifted beyond the optimal power value $PR_0$, there is a possibility to incur potential damage to the opt-magnetic disc 9, and thus, this method is not recommended for use.

Figure 14:
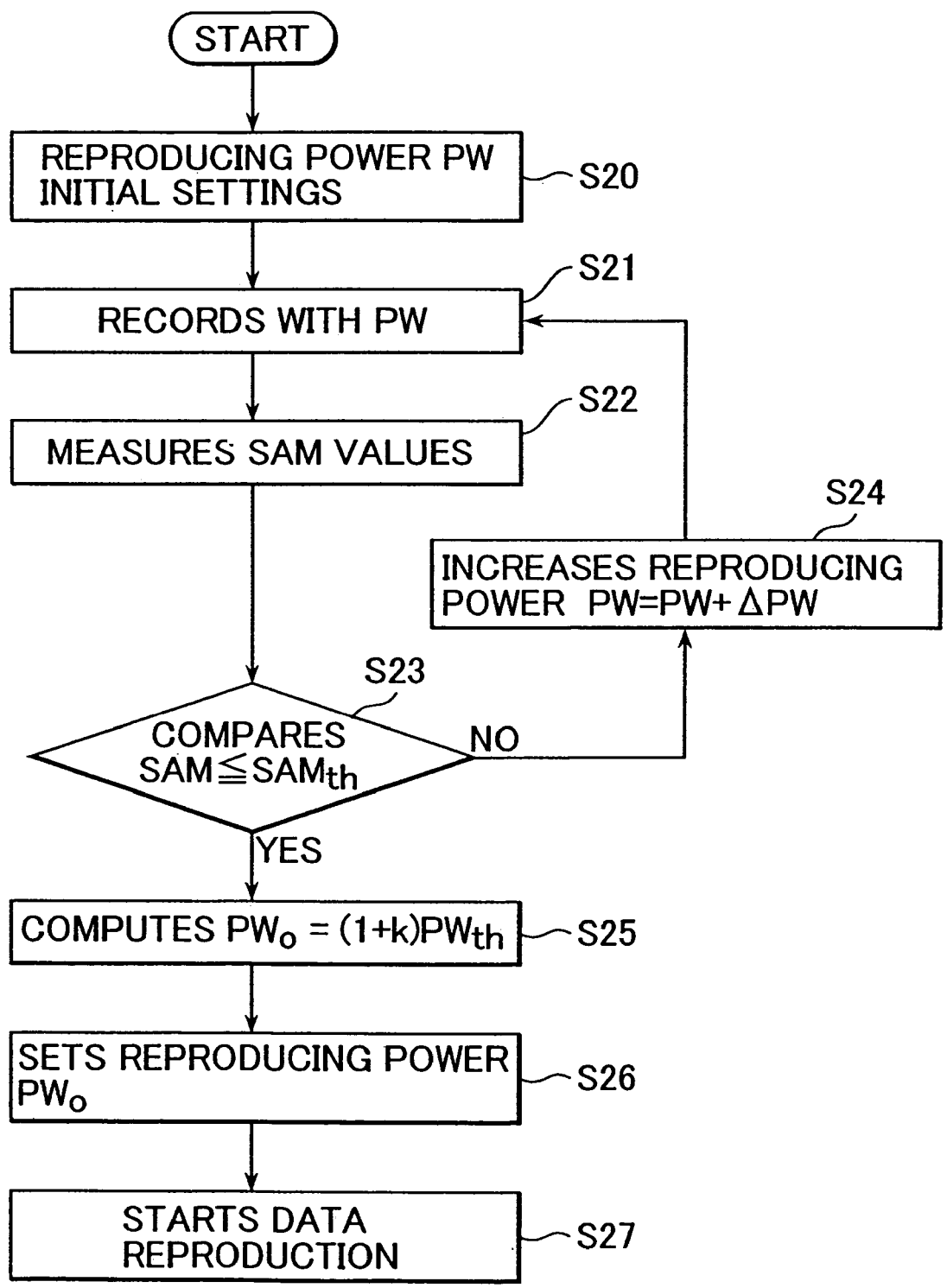
FIG. 14 shows a flowchart that exemplifies serial processes for setting recording power by utilizing SAM values according to a preferred embodiment of the present invention.

Next, the control system at time of recording mode is described below. FIG. 14 shows a flowchart that exemplifies serial processes for setting recording power by applying the SAM values. Except for the process corresponding to step S21 for determining the SAM values by way of reproducing a signal provisionally recorded on the magneto-optical disc 9 added to the flowchart shown in FIG. 12, serial steps of the flowchart shown in FIG. 14 substantially coincide with the one shown in FIG. 12.

At step S20, initial recording power PW is set. When step S21 is entered, data is recorded the magneto-optical disc 9 by applying the initially set recording power PW Next, step S22 is entered, in which immediately after being recorded, the recorded data is reproduced and the SAM values are measured. At step S23, the resultant value of the SAM measured via the step S22 is compared to the preset reference value $SAM_{th}$. If the compared result is identified to be different from SAM value≦reference value $SAM_{th}$, then, operation proceeds to step S24, in which recording power PW is increased. This brings the operating mode back to step S21, in which recording of data is again performed by applying the increased recording power PW, and then, immediately after completing the recording operation, the recorded data is reproduced and the SAM values are measured.

On the other hand, if it is identified in step S23 that the resultant value corresponds to SAM values≦reference value $SAM_{th}$, then, operating mode proceeds to step S25. At S25, by way of determining the recording power PW compatible with "the measured SAM values≦reference value $SAM_{th}$" identified in step S23 as the power value $PW_{th}$, the power value $PW_{th}$ is multiplied by a value (1+"k"), where "k" designates a predetermined coefficient. The resultant value $(1+k)PW_{th}$ is determined as the optimal recording power $PW_0$.

Upon entering step S26, the optimal recording power $PW_0$ is established in the magnetic field modulating driver 6. Next, step S27 is entered, in which the optimal recording power $PW_0$ activates recording of data on the magneto-optical disc 9.

Figure 15:
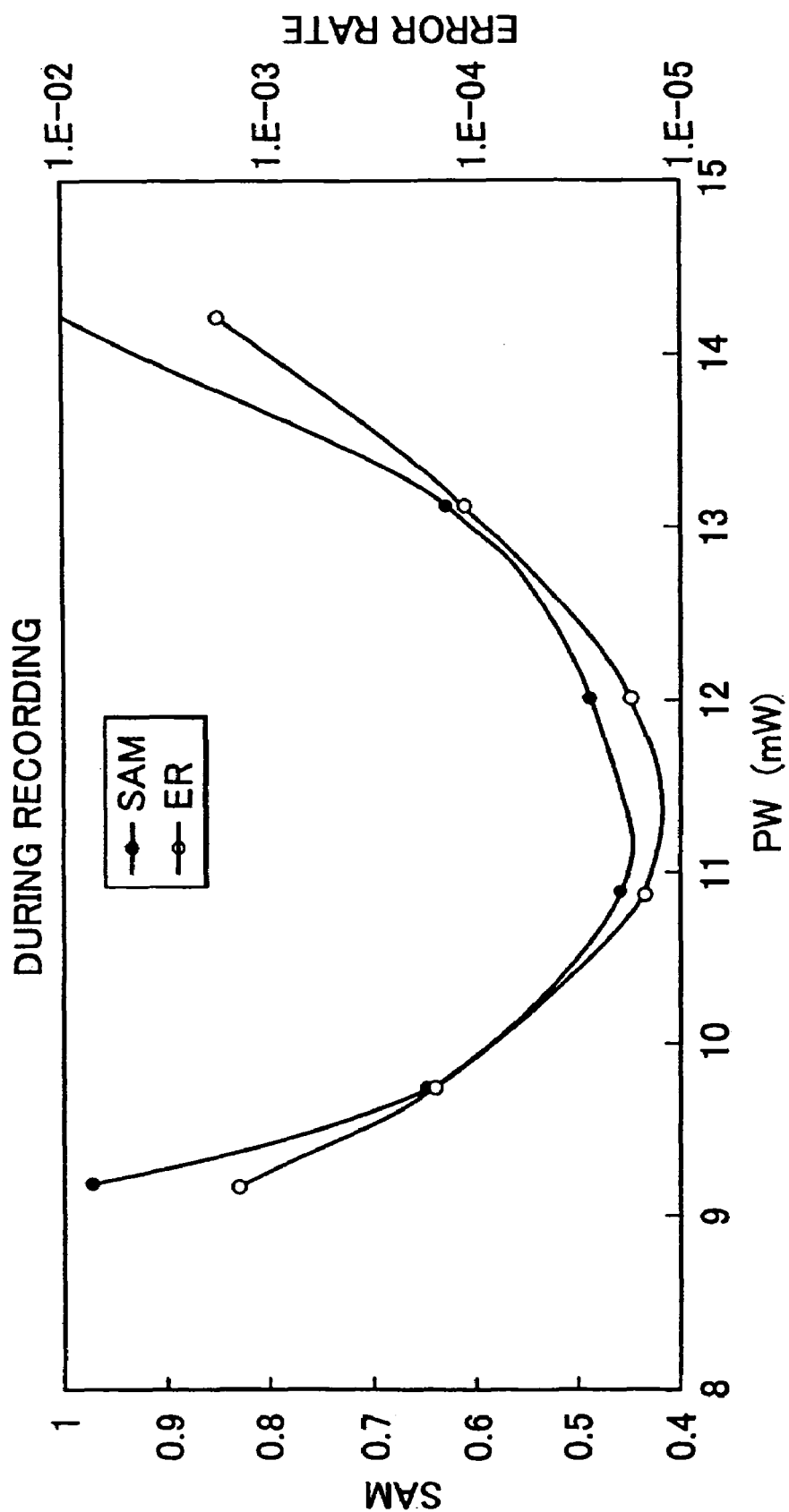
FIG. 15 shows a graphic representation that exemplifies the result of measuring the SAM values and the error rate against the recording power PW according to a preferred embodiment of the present invention.

FIG. 15 exemplifies a result of measuring the SAM values and error rate against the recording power PW It is understood from the graphic representation shown in FIG. 15 that there is a certain correlation between the SAM values shown by means of black circles (●) and error rates shown by white circles (○) against the recording power PW. For example, when the reference value $SAM_{th}$ is set to be 0.6, the corresponding recording power $PW_{th}$ becomes approximately 10 mW. On the other hand, the optimal recording power $PW_0$ for minimizing the SAM values becomes approximately 11 mW. Accordingly, in this example, based on an equation (1+0.1)×10 mW=11 mW, coefficient "k" corresponds to k=0.1.

Next, a third preferred embodiment of the present invention is described below. The third preferred embodiment includes a further improved version from the above-described first preferred embodiment and a variation version of the first preferred embodiment of the present invention. In the method for implementing the first preferred embodiment of the present invention, in the course of selecting SAM values, substantially one half the SAM samples valid for executing statistical process is discarded. In other words, as shown in FIG. 5, such a constant (corresponding to minimum SAM value for ideally-reproduced signal) generated in the constant generating circuit 311 is compared to the SAM values in the course of selecting the SAM values, and then, while the SAM values remain below the constant value, an averaging process is executed by the averaging circuit 315, which then outputs the reproduced signal evaluation values. Accordingly, this in turn means that the SAM samples with such SAM values beyond the constant value are consequently discarded.

On the other hand, in the construction of the variation example of the first preferred embodiment shown in FIG. 8, it is possible to secure more accurate SAM evaluation values. However, in the construction shown in FIG. 8, inasmuch as the value set to the constant generating circuit 352 is dependent on the characteristics of modulation codes of the recorded data, in order to deal with change of modulation codes, it is necessary to properly set the constant in correspondence with the changed modulation codes.

In such a reproduction system adopting such modulation codes having a minimum run of 1 or more, even when computing SAM values against such ideally equalized and noise-free reproduced signal, there is still a characteristics in which the SAM values vary depending on data pattern. As a result, it is not possible to adopt a method for merely obtaining standard deviation of the SAM values for the sake of evaluation of degradation of signal quality caused by equalization error, adverse influence of noise component or the like. In order to deal with such problem, in the above-referred first preferred embodiment and the variation example of the first preferred embodiment of the present invention, it is so arranged that the reproduced signal evaluation values can be computed by way of averaging the square of the difference between the SAM values below the minimum SAM value for the ideally reproduced signal and the minimum SAM value.

In contrast with the above arrangement, in the third preferred embodiment of the present invention, initially, a pattern matching is executed as against the detected data array, and then, if ideal waveforms are generated, SAM values are computed solely against such pattern suitable for minimizing the SAM values.

Figure 16:
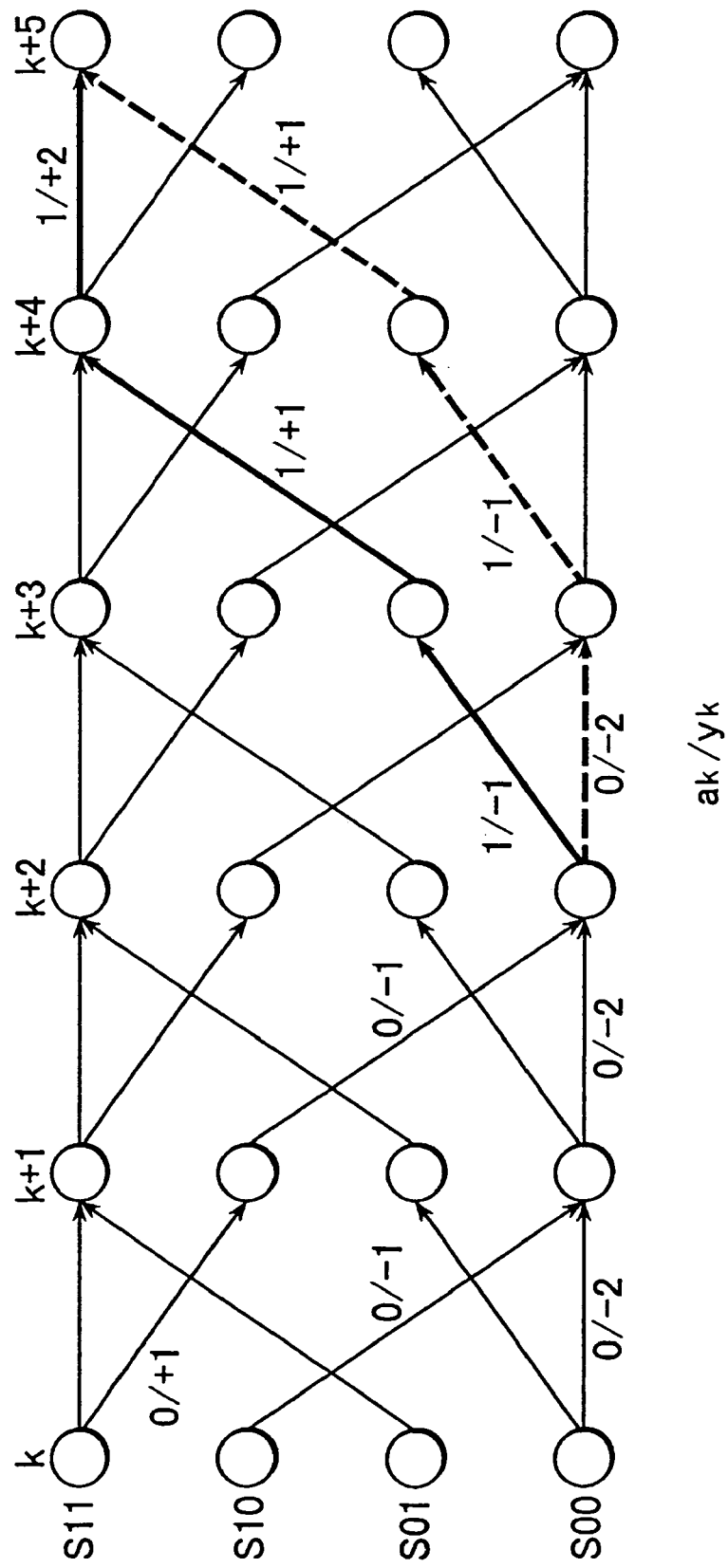
FIG. 16 shows a trellis diagram ranging from the time "k" to the time "k+5" corresponding to the combination of RLL (1,7) and PR (1,2,1) according to a preferred embodiment of the present invention.

FIG. 16 describes a trellis diagram ranging from time "k" to time "k+5". At time "k+5", the SAM values for ideally reproduced signal can be minimized in a case in which either the path-metrics shown by means of bold solid lines are compared to the path-metrics shown by broken lines shown in FIG. 16 or the polarity of the reproduced signal is reversed, in other words, when the paths shown in FIG. 16 are reversed upside down.

First, the method of computing the SAM values when it is identified that such paths shown by means of bold solid lines shown in FIG. 16 are right is described below. Path-metric $PMM_c$ of thick-solid-line paths ranging from the time "k+2" to the time "k+5" and another path-metric $PMM_w$ of paths shown by broken lines are individually obtained by applying equation (6) and another equation (7) shown below.

[Equation 1]

$$PMM_c = -\{y_{k+2}-(-1)\}^2 - \{y_{k+3}-(+1)\}^2 - \{y_{k+4}-(+2)\}^2 \quad (6)$$

[Equation 2]

$$PMM_w = -\{y_{k+2}-(-2)\}^2 - \{y_{k+3}-(+1)\}^2 - \{y_{k+4}-(+1)\}^2 \quad (7)$$

Accordingly, the actual SAM value is obtained from equation (8) shown below.

[Equation 3]

$$SAM = PMM_c - PMM_w = 2y_{k+2} + 4y_{k+3} + 2y_{k+4} \quad (8)$$

On the other hand, if it is identified that the paths shown by broken lines shown in FIG. 16 are the right ones, it is so arranged that the path-metric $PMM_c$ and $PMM_w$ shown in the above equations (6) and (7) are replaced with each other. Accordingly, the actual SAM value is obtained by equation (9) shown below.

[Equation 4]

$$SAM = -2y_{k+2} - 4y_{k+3} - 2y_{k+4} \quad (9)$$

Either of the above equations (8) and (9) computes the SAM value based on the data array detected by a maximum likelihood decoder, and thus, it is suggested that the SAM value be computed as an absolute value as per equation (10) shown below.

[Equation 5]

$$SAM = |2y_{k+2} + 4y_{k+3} + 2y_{k+4}| \quad (10)$$

In addition, as it has been described earlier with regard to the first preferred embodiment of the present invention, in a strict sense, the SAM values computed based on- the difference between the degree of probability of such a data array identified to be most probable by the maximum likelihood decoder and the degree of probability of a data array identified to be erroneous by this decoder are approximate values.

Next, a condition for comparing the paths shown by bold solid lines to the broken-line paths shown in FIG. 16 for constituting the SAM values is described below. According to the diagram shown in FIG. 16, the solid-line paths and the broken-line paths individually pass through the condition S00 at the time "k+2". In this case, even when any of these paths is selected during a period ranging from the time "k" to the time "k+2", data $\{a_k, a_{k+1}\}$ always correspond to $\{0, 0\}$. Accordingly, when the data $\{a_k, a_{k+1}, a_{k+2}, a_{k+3}, a_{k+4}\}$ individually correspond to $\{0, 0, 1, 1, 1\}$, solid-line paths are selected, whereas for values $\{0, 0, 0, 1, 1\}$, the broken-line path is selected.

When solid-line paths are selected, there may be a case in which the path subject to comparison at the time "k+5" is not the broken-line path, this corresponds to the case in which the waveforms of the reproduced signal have significantly large distortion, although usually this can be ignored. The same applies to a case in which broken-line paths have been selected. In addition, such case is also conceivable when polarity of the reproduced signal is inverted from the example shown in FIG. 16. Accordingly, it is necessary to establish an equation (11) shown below.

[Equation 6]

When $$\{a_k, a_{k+1}, a_{k+3}, a_{k+4}\} = \{0,0,1,1\} \text{ or } \{1,1,0,0\}, \text{ then}$$

$$SAM = |2y_{k+2} + 4y_{k+3} + 2y_{k+4}| \quad (11)$$

Figure 17:
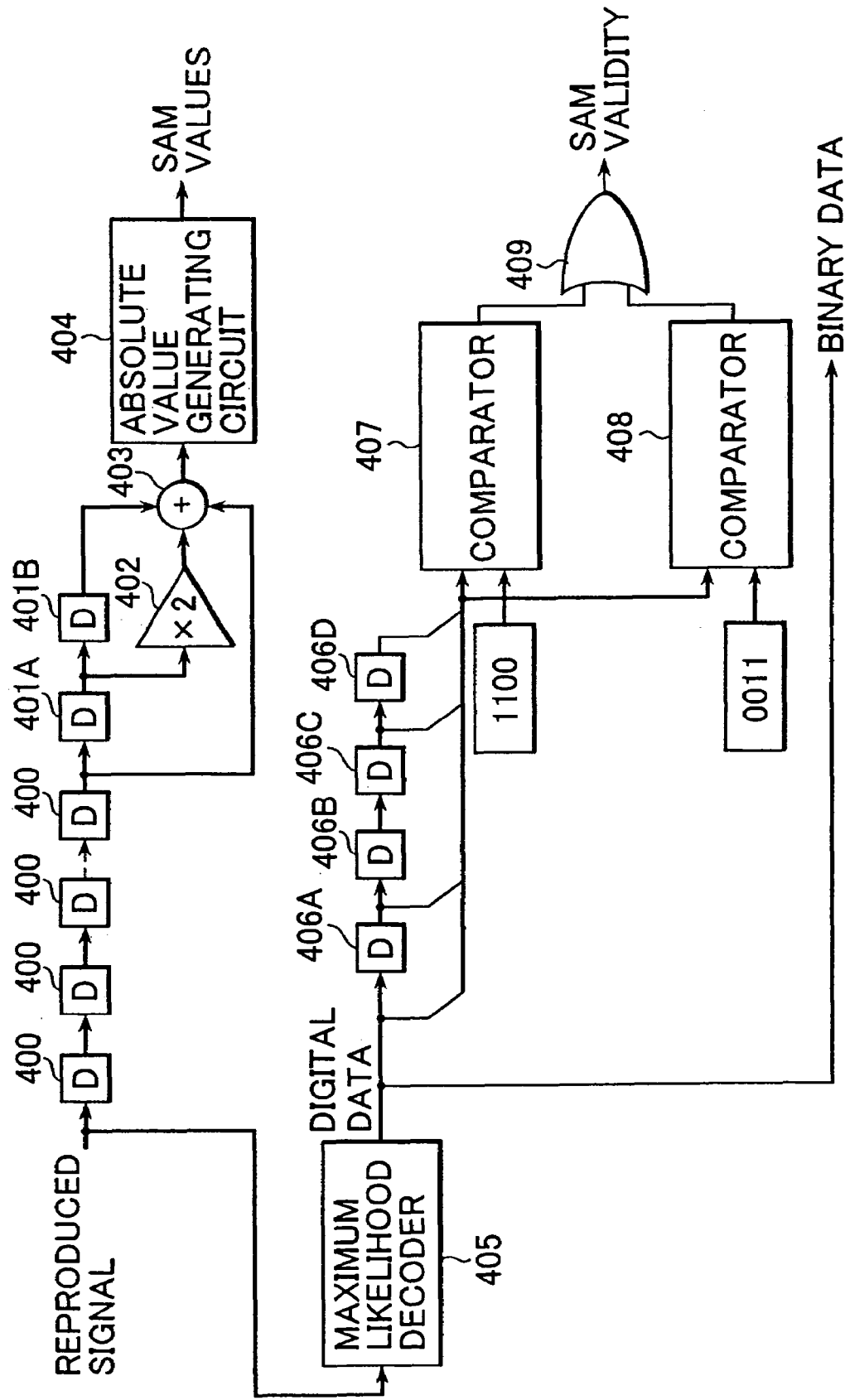
FIG. 17 shows a schematic block diagram that exemplifies a system for computing SAM values based on a method according to a third preferred embodiment of the present invention.

FIG. 17 exemplifies a schematic block diagram of the inventive system for computing the SAM values based on the method according to the above-described third preferred embodiment of the present invention. For example, initially, signal reproduced from a reproduction head from a recording medium such as an magneto-optical disc is transmitted to a plurality of delay circuits 400, 400, . . . in order to supply the reproduced signal with a predetermined delay, along with supplying the delayed reproduced signal to a maximum likelihood decoder 405. In addition, in this example, it is assumed that multi-bit digital signal is converted via an A/D (analog/digital) converter by applying a channel clock reproduced by means of a PLL (phase locked loop).

Those plural delay circuits 400, 400, . . . and delay circuits 406A~406D shown by "D" in FIG. 17 constitute a 1 clock delaying element for providing input signal with a delay corresponding to one clock. It is possible to utilize a D-flip-flop for individual delay circuits 400, 400, . . . These delay circuits 400, 400, . . . individually compensate the delay of the reproduced signal until binary data is detected by the maximum likelihood decoder 405 to be described later and also compensate delay for generating SAM validity signal. Actual number of delay circuits 400 is determined in order that the timing of computing and outputting the SAM values match the timing of outputting of the SAM validity signal.

After being provided with a certain delay by the plural delay circuits 400, 400, . . . , the reproduced signal is then supplied to a SAM value computing circuit including a pair of delay circuits 401A and 401B, a multiplying circuit 402, an adder 403, and an absolute-value generating circuit 404. Based on the reproduced signal supplied through delay circuits 401A and 401B, the multiplying circuit 402, and the adder 403, the SAM value computing circuit computes equation "$y_{k+2}+2y_{k+3}+y_{k+4}$". The reproduced signal outputted from the adder 403 is supplied to the absolute-value generating circuit 404 and, if the result of computing the above equation "$y_{k+2}+2y_{k+3}+y_{k+4}$" is a negative number, the resultant value is converted to a positive number.

In addition, it should be noted that the SAM value computed by the SAM computing circuit corresponds to one-half the value computed by the above equation (5). However, this merely corresponds to a problem for determining which bit is taken as a unit bit, so that there is no substantial difference between both values.

On the other hand, binary data is detected from the reproduced signal supplied to the maximum likelihood decoder 405 based on the configuration of the above first preferred embodiment of the present invention shown in FIG. 2. Detected binary data is directly outputted while supplied to the delay circuits 406A, 406B, 406C, and 406D, and the binary data is delayed by a period corresponding to 4 clocks. Next, binary data inputted into the delay circuits 406A, 406B, and 406D and the delayed signal outputted from the delay circuit 406D, are respectively extracted, then respectively supplied to comparators 407 and 408 as a data array $\{a_k, a_{k+1}, a_{k+3}, a_{k+4}\}$.

The comparator compares the data array $\{a_k, a_{k+1}, a_{k+3}, a_{k+4}\}$ to the data array $\{0,0,1,1\}$. Likewise, at the other comparator 408, the data array $\{a_k, a_{k+1}, a_{k+3}, a_{k+4}\}$ is compared to the other data array $\{1,1,0,0\}$. Comparative results outputted from the comparators 407 and 408 are jointly supplied to an OR circuit 409, which then outputs a SAM validity signal for identifying that the output SAM value is valid. More specifically, when the data array $\{a_k, a_{k+1}, a_{k+3}, a_{k+4}\}$ matches with either of the data array $\{0,0,1,1\}$ and the other data array $\{1,1,0,0\}$, it is identified that the SAM value outputted from the above absolute value generating circuit 404 is valid.

It is possible to utilize standard deviation of the SAM value outputted from the above-referred absolute value generating circuit 404 as the value for evaluation of reproduced signal However, when accurately computing the standard deviation of the SAM value by applying hardware, it in turn requires expansion of the scope of computing circuit, and thus, this is not practically useful. Next, a method of computing the value for evaluation of reproduced signal based on consideration to facilitate utilization of hardware is described below.

A first method for computing the value for evaluation of reproduced signal is described below. In such a computing system in which variation of the mean value of the SAM values is conceived to be negligible within presumable range of the recording and reproducing condition, by way of simply utilizing the mean value of the expected SAM values as a constant, it is possible to utilize the result of computing the average of the square of the difference between this constant and individual SAM values as the value for evaluation the reproduced signal.

Figure 18:
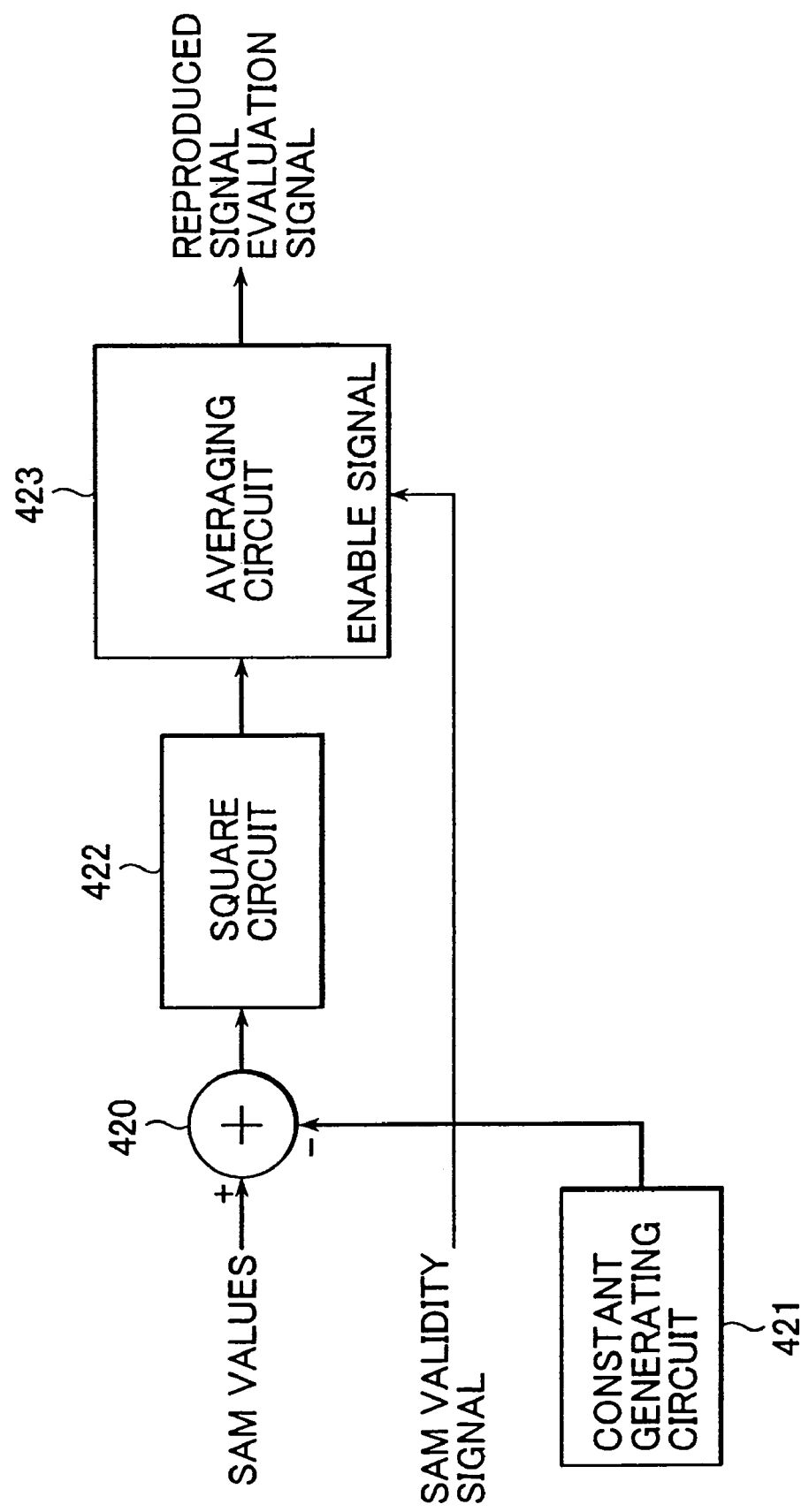
FIG. 18 shows a schematic block diagram that exemplifies a reproduced signal evaluation value computing circuit based on a first method according to the third preferred embodiment of the present invention.

FIG. 18 exemplifies a configuration of the reproduced signal evaluation value computing circuit based on the first preferred embodiment of the present invention. The SAM values outputted from the absolute value generating circuit shown in FIG. 17 is transmitted to an adder 420. On the other hand, a constant generating circuit 421 generates an expected average value of the SAM values as a constant. Then, the constant generated by the constant generating circuit 421 is supplied to the adder 420 as a negative input data, in which the constant value is subtracted from the SAM values. The output from the adder 420 is then supplied to a square circuit 422 and then squared. The squared output is then supplied to an averaging circuit 423, which then averages the value outputted from the square circuit 422 at a time in which the SAM validity signal outputted from an OR circuit 408 identifies the validation of the SAM values. Finally, the average value is outputted from the averaging circuit 423 as a latest signal quality evaluation value.

The averaging circuit 423 may compute a mean value of the values of a predetermined number of samples or a mean value of values within a predetermined period of time outputted from the square circuit 422 or it may also compute a moving average of the values outputted from the square circuit 422.

Figure 19:
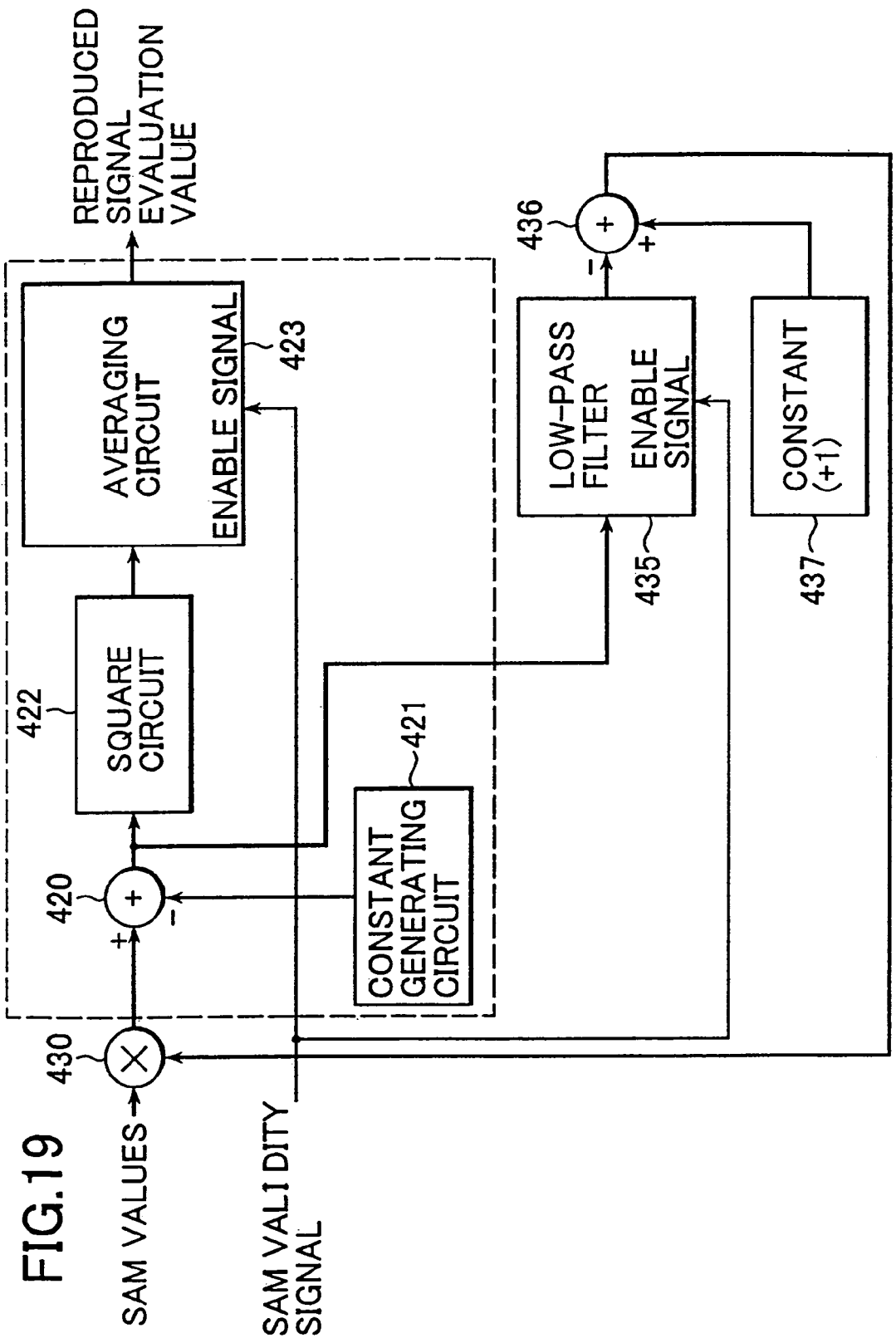
FIG. 19 shows a schematic block diagram that exemplifies a reproduced signal evaluation value computing circuit based on a second method according to the third preferred embodiment of the present invention.

Next, a second method for computing the reproduced signal evaluation of signal is described below. The second method is applied to a case in which the mean value of the SAM values cannot be evaluated in advance. FIG. 19 exemplifies a construction of the reproduced signal evaluation of signal computing circuit based on the second method. Those components shown in FIG. 19 corresponding to the components already shown in FIG. 18 are designated by identical reference numerals, thus further description will be omitted. The component portion surrounded by a broken line shown in FIG. 19 comprises such a construction identical to what is shown in FIG. 18.

SAM values outputted from the absolute value generating circuit 404 of FIG. 17 are multiplied by a coefficient by an multiplier circuit 430 and then supplied to the adder 420. The constant to be supplied to the multiplier circuit 430 is controlled by way of applying a feedback process to cause the average of the difference between the data outputted from the multiplier circuit 430 and the constant generated by the constant generating circuit 421 to become zero.

In other words, output from the adder 420 is supplied to a low-pass filter 435. The low-pass filter 435 integrates output from the adder 420 when the adder 420 receives the SAM validity signal as an "enable" signal to enable the SAM validity signal to verify validation of the SAM values.

Next, output from the low-pass filter 435 is supplied to an adder 436 as negative input data. The adder 436 then subtracts the output from the low-pass filter 435 from a constant (+1) generated by the constant generating circuit 437. From the output from the adder 436 constitutes the coefficient of the multiplier circuit 430.

By way of implementing the above controlling process, it is possible to consider that output from the multiplier circuit 430 corresponds to a SAM value being standardized by way of substantially becoming equal to the average value preset as a constant by the constant generating circuit 421. As a result, output from the averaging circuit 423 becomes substantially equal to the dispersion of the standardized SAM values, and thus, it is possible to utilize the output from the averaging circuit 423 as the reproduced signal evaluation value.

In many cases, distribution of the SAM values correspond to a symmetrical distribution in relation to an average value as in a Gaussian distribution. As a result, by means of applying this characteristics, by way of converting negative values into (−1) and positive values into (+1) at the input terminal of the low-pass filter 435, it is possible to simplify the circuit construction while preserving accuracy of the evaluation values.

Like the above-described first preferred embodiment and the variation example from the first preferred embodiment, the method for computing the reproduced signal evaluation value and the computing system based on the third preferred embodiment of the present invention are also applicable to the recording and reproducing apparatus based on the second embodiment of the present invention. In other words, based on the reproduced signal evaluation for a signal acquired by utilizing the system configuration and the method related to the third preferred embodiment, it is possible to control reproducing operation in the recording and reproducing apparatus based on the second embodiment of the present invention.

For example, those embodiments shown in FIG. 17 and FIG. 18 or FIG. 19 according to the third preferred embodiment of the present invention are also applied to an RF signal demodulator shown in FIG. 11. During the reproducing mode, signal reproduced from an magneto-optical disc 9 via an optical system is amplified by an RF amplifier 34 up to a predetermined amplitude to become an RF signal 35, which is then transmitted to an RF signal-demodulator 13. The RF signal 35 is then demodulated by the RF signal demodulator and then outputted as a reproduced signal 26. At this event, the demodulated RF signal 35 is subject to an A/D conversion in the RF signal demodulator 13 by applying a channel clock reproduced by a PLL a mentioned above and then, the reproduced signal 26 is outputted as a multi-bit digital signal.

The above reproduced signal 26 is then inputted into the integral circuit shown in FIG. 17. Then, based on the reproduced signal 26, the SAM values are obtained. Further, based on the binary data array, the SAM validity signal is outputted, where the binary data array is stored in the memory 15. Next, the SAM values and the SAM validity signals are supplied to the circuit shown in FIG. 18 or FIG. 19, whereby generating the reproduced signal evaluation value. Then the reproduced signal evaluation of signal is supplied to the controller 19 for example. Then, based on the received reproduced signal evaluation, in order that intensity of laser power (i.e., reproducing power) generated via the optical system 10 be optimized, the controller 19 transmits a controlling signal to the servo circuit 12. The controlling of recording power can be performed based on the flowchart of FIG. 12.

During recording mode, immediately after data is recorded on the magneto-optical disc 9 via a magnetic head 8, the recorded signal is reproduced by the optical system 10, thus generating the reproduced signal evaluation via the processes mentioned above. Based on the reproduced signal evaluation, it is possible to properly control recording operation against the magneto-optical disc 9 by way of optimizing recording power via properly a controlled operation of the magnetic-field modulating driver 6. Operation for properly controlling the recording power is executed based on the flowchart shown in FIG. 14.

Although the above description has thus far been done in order to describe the present invention applied to an apparatus for recording and reproducing a signal on an magneto-optical disc or a magnetic super resolution magneto-optical disc, the scope of the present invention is not limited to the above preferred embodiments, but it is also applicable to a variety of apparatuses capable of decoding reproduced signal by applying a maximum likelihood decoder such as a hard-disc reproducing apparatus, for example.

Although the present invention having been described in its preferred form with a certain degree of particularity, obviously many changes, variation and combinations are possible. It is therefore to be understood that any modifications will be practiced otherwise than as specifically described herein without departing from the scope of the present invention.

What is claimed is:

1. A reproduced signal evaluation apparatus for evaluating a signal reproduced from a recording medium, comprising:
   a binary data detecting means for decoding said signal reproduced from said recording medium by maximum likelihood decoding;
   a SAM value computing means for computing a SAM value in real time based on a result of detection by said binary data detecting means, wherein SAM means Sequenced Amplitude Margin; and
   a reproduced signal evaluation means for evaluating said reproduced signal based on said SAM value computed by said SAM value computing means,
   wherein said recording medium comprises an optical recording medium or an magneto-optical recording medium from which recorded data is reproduced by an optical means; and
   wherein a quality of said reproduced signal, that is obtained when data recorded on said recording medium under a recording optical output power and reproduced under a different reproducing optical output power, is evaluated by said reproduced signal evaluation means using said SAM value computed by said SAM value computing means and, based on a result of said evaluation, an optimal reproducing optical output power is determined for reproducing data recorded on said recording medium.

2. A reproduced signal evaluation method for evaluating a signal reproduced from a recording medium, said method comprising:
   a binary data detecting step for detecting binary data by decoding said signal reproduced from said recording medium by maximum likelihood decoding;
   a SAM value computing step for computing a SAM value in real time based on a result of detection by said binary data detecting step, wherein SAM means Sequenced Amplitude Margin; and a reproduced signal evaluation step for evaluating said reproduced signal based on said SAM value computed by said SAM value computing step, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said reproduced signal evaluation step using said SAM value computed by said SAM value computing step and, based on a result of said evaluation, an optimal reproducing optical output power is determined for reproducing data recorded on said recording medium.

3. A reproducing apparatus for reproducing a signal recorded on a recording medium and converting said signal into binary data, said reproducing apparatus comprising:

a reproducing means for reproducing a signal recorded on said recording medium;

a binary data detecting means for detecting binary data by decoding said signal reproduced from said reproducing means by maximum likelihood decoding;

a SAM value computing means for computing a SAM value based on a result of detection from said binary data detecting means, wherein SAM means Sequenced Amplitude Margin;

a reproduced signal evaluation means for evaluating said reproduced signal based on said SAM value computed by said SAM value computing means; and a reproduction controlling means for controlling said reproducing means based on a result of said evaluation by said reproduced signal evaluation means, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said reproduced signal evaluation means using said SAM value computed by said SAM value computing means and, based on a result of said evaluation, an optimal reproducing optical output power is determined for reproducing data recorded on said recording medium.

4. The reproducing apparatus according to claim 3, wherein a value, obtained by multiplying a predetermined coefficient and a lowest reproducing optical output power among reproducing optical output powers having said SAM value equal or lower than a reference SAM value during said reproduction, is determined as said optimal reproducing optical output power.

5. A reproduction method for reproducing a signal recorded on a recording medium and converting said reproduced signal into binary data, said reproduction method comprising reproducing step for reproducing said signal recorded on said recording medium;

binary data detecting step for detecting binary data by decoding a signal reproduced from said reproducing step by maximum likelihood decoding;

SAM value computing step for computing a SAM value based on a result of detection from said binary data detecting step, wherein SAM means Sequenced Amplitude Margin;

reproduced signal evaluation step for evaluating said reproduced signal based on said SAM value computed by said SAM value computing step; and reproduction controlling step for controlling said reproducing step based on a result of said evaluation by said reproduced signal evaluation step, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said reproduced signal evaluation step using said SAM value computed by said SAM value computing step and, based on a result of said evaluation, an optimal reproducing optical output power is determined for reproducing data recorded on said recording medium.

6. A recording apparatus for recording modulated data on a recording medium, said apparatus comprising:

a recording means for modulating data and recording said data on said recording medium;

a reproducing means for reproducing a signal recorded on said recording medium;

a binary data detecting means for detecting binary data by decoding said signal reproduced from said reproducing means by maximum likelihood decoding;

a SAM value computing means for computing a SAM value based on a result of detection from said binary data detecting means, wherein SAM means Sequenced Amplitude Margin;

a reproduced signal evaluation means for evaluating said reproduced signal based on said SAM value computed by said SAM value computing means; and a recording controlling means for controlling said recording means based on a result of said evaluation by said reproduced signal evaluation means, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said reproduced signal evaluation means using said SAM value computed by said SAM value computing means and, based on a result of said evaluation, an optimal reproducing optical output power is determined for reproducing data recorded on said recording medium.

7. The recording apparatus according to claim 6, wherein a value, obtained by multiplying a predetermined coefficient and a lowest reproducing optical output power among reproducing optical output powers having said SAM value equal or lower than a reference SAM value during said reproduction, is determined as said optimal reproducing optical output power.

8. A recording method for recording modulated data on a recording medium, said method comprising:

a recording step for modulating data and recording said data on said recording medium;

a reproducing step for reproducing a signal recorded on said recording medium;

a binary data detecting step for detecting binary data by decoding said signal reproduced from said reproducing step by maximum likelihood decoding;

a SAM value computing step for computing a SAM value based on a result of detection from said binary data detecting step, wherein SAM means Sequenced Amplitude Margin;

a reproduced signal evaluation step for evaluating said reproduced signal based on said SAM value computed by said SAM value computing step; and a recording controlling step for controlling said recording step based on a result of said evaluation by said reproduced signal evaluation step, wherein said recording medium comprises an optical recording medium or an magneto-optical recording medium from which recorded data is reproduced by an optical means; and wherein a quality of step reproduced signal, that is obtained when data recorded on said recording medium under a recording optical output power and reproduced under a different reproducing optical output power, is evaluated by said reproduced signal evaluation step using said SAM value computed by said SAM value computing step and, based on a result of said evaluation, an optimal reproducing optical output power is determined for reproducing data recorded on said recording medium.

9. A recording method for recording data on a recording medium upon modulating said data by using a modulation code having a minimum nm of one or more, said reproducing method comprising:

a recording step for recording data on said recording medium after said data is modulated by said modulation code having said minimum run of one or more;

a reproducing step for reproducing a signal from said recording medium after recording said signal on said recording medium with said recording step;

a binary data detecting step for detecting binary data after decoding a reproduced signal reproduced from said recording medium by said reproducing step applying a maximum likelihood decoding;

a SAM value computing step for computing a SAM value based on said reproduced signal, wherein SAM means Sequenced Amplitude Margin;

a reproduced signal evaluation step for performing pattern matching against a pattern of data array obtained from said binary data detected by said binary data detecting step; selecting a SAM value for said pattern having minimum SAM if a reproduced wave form is ideal: and evaluating said reproduced signal by a applying a statistical process to said selected SAM value; and a recording controlling step for controlling said reproducing means based on a result of said evaluation by said reproduced signal evaluation step, wherein said recording medium comprises an optical recording medium or an magneto-optical recording medium from which recorded data is reproduced by an optical means; and wherein a quality of said reproduced signal, that is obtained when data recorded on aid recording medium under a recording optical output power and reproduced under a different reproducing optical output power, is evaluated by said reproduced signal evaluation step using said SAM value computed by said SAM value computing step and, based on a result of said evaluation, an optimal reproducing optical output power is determined for reproducing data recorded on said recording medium.

10. A reproduced signal evaluation apparatus for evaluating a signal reproduced from a recording medium, comprising:

a binary data detector decoding said signal reproduced from said recording medium using maximum likelihood decoding;

a SAM value computation unit computing a SAM value based on the detection result; and a reproduced signal evaluation unit evaluating said reproduced signal based on the computed SAM value, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said reproduced signal evaluation unit using said SAM value computed by said SAM value computation unit and, based on a result of said evaluation, an optimal reproducing optical output power is determined for reproducing data recorded on said recording medium.

11. A reproduced signal evaluation method for evaluating a signal reproduced from a recording medium, said method comprising:

detecting binary data by decoding said signal reproduced from said recording medium using maximum likelihood decoding;

computing a SAM value based on the detection result; and evaluating said reproduced signal based on the computed SAM value, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said evaluating step using said SAM value computed by said computing step and, based on a result of said evaluation, an optimal reproducing optical output power is determined for reproducing data recorded on said recording medium.

12. A reproducing apparatus for reproducing a signal recorded on a recording medium and converting said signal into binary data, said reproducing apparatus comprising:

a reproducing unit reproducing a signal recorded on said recording medium;

a binary data detector detecting binary data by decoding said signal reproduced from said reproducing means using maximum likelihood decoding;

a SAM value computation unit computing a SAM value based on the detection result;

a reproduced signal evaluation unit evaluating said reproduced signal based on the computed SAM value; and a reproduction controller controlling said reproducing unit based on the evaluation result, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said reproduced signal evaluation unit using said SAM value computed by said SAM value computation unit and, based on a result of said evaluation, an optimal reproducing optical output power is determined for reproducing data recorded on said recording medium.

13. A reproduction method for reproducing a signal recorded on a recording medium and converting said reproduced signal into binary data, said reproduction method comprising:

reproducing said signal recorded on said recording medium;

detecting binary data by decoding the reproduced signal using maximum likelihood decoding;

computing a SAM value based on the detection result;

evaluating said reproduced signal based on the computed SAM value; and controlling said reproducing based on the evaluation result, wherein said recording medium comprises an optical recording medium or an magneto-optical recording medium from which recorded data is reproduced by an optical means; and wherein a quality of said reproduced signal, that is obtained when data recorded on said recording medium under a recording optical output power and reproduced under a different reproducing optical output power, is evaluated by said evaluating step using said SAM value computed by said computing step and, based on a result of said evaluation, an optimal reproducing optical output power is determined for reproducing data recorded on said recording medium.

* * * * *